(12) United States Patent
Kasukabe

(10) Patent No.: US 7,227,370 B2
(45) Date of Patent: Jun. 5, 2007

(54) SEMICONDUCTOR INSPECTION APPARATUS AND MANUFACTURING METHOD OF SEMICONDUCTOR DEVICE

(75) Inventor: Susumu Kasukabe, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 70 days.

(21) Appl. No.: 11/270,531

(22) Filed: Nov. 10, 2005

(65) Prior Publication Data
US 2006/0139042 A1 Jun. 29, 2006

(30) Foreign Application Priority Data
Dec. 28, 2004 (JP) ............................. 2004-378504

(51) Int. Cl.
*G01R 31/02* (2006.01)
(52) U.S. Cl. ...................... 324/754; 324/756; 324/757
(58) Field of Classification Search .................... None
See application file for complete search history.

(56) References Cited

U.S. PATENT DOCUMENTS 5,945,834 A * 8/1999 Nakata et al. ............... 324/754
6,265,888 B1 * 7/2001 Hsu ............................ 324/760
6,340,895 B1 * 1/2002 Uher et al. .................. 324/755

FOREIGN PATENT DOCUMENTS

JP        7-283280      10/1995
JP        11-135582     5/1999

* cited by examiner

*Primary Examiner*—Minh N. Tang
(74) *Attorney, Agent, or Firm*—Antonelli, Terry, Stout & Kraus, LLP.

(57) ABSTRACT

When electrical properties of semiconductor chips of a semiconductor wafer are inspected by bringing plural contact terminals disposed on the principal surface of a probe sheet of a probe cassette constituting a semiconductor inspection apparatus into contact with plural electrodes of the plural semiconductor chips on the principal surface of the semiconductor wafer which is disposed so as to face the principal surface of the probe sheet, the air pressure of the space formed between the facing surfaces of the principal surface of the probe sheet and the principal surface of the semiconductor wafer is reduced so as to suck the semiconductor wafer toward the side of the principal surface of the probe sheet and deform mainly the semiconductor wafer, thereby pressing the plural electrodes of the plural semiconductor chips of the semiconductor wafer against the plural facing contact terminals of the principal surface of the probe sheet.

11 Claims, 22 Drawing Sheets

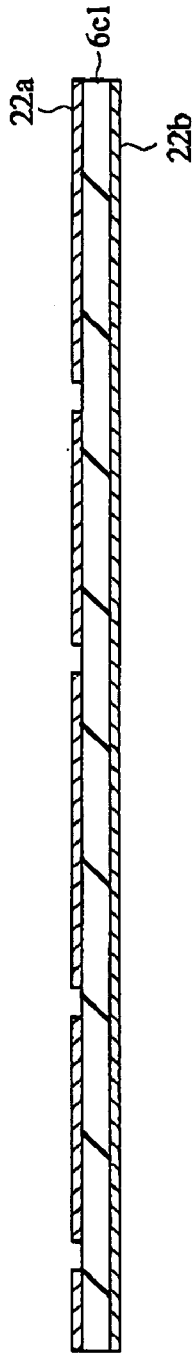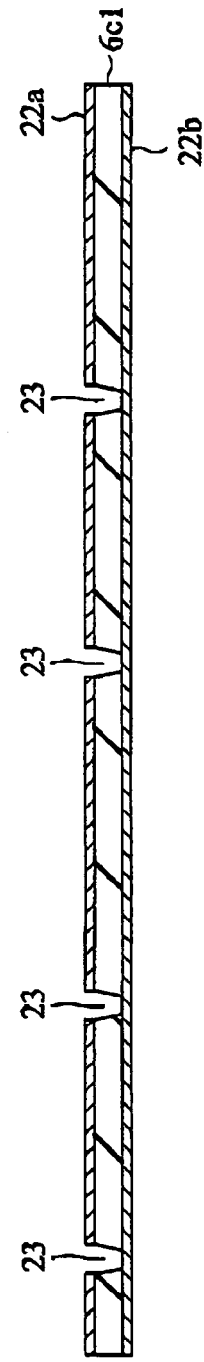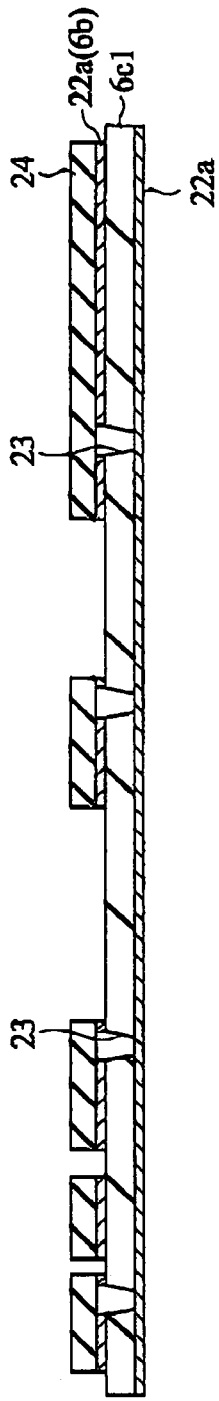

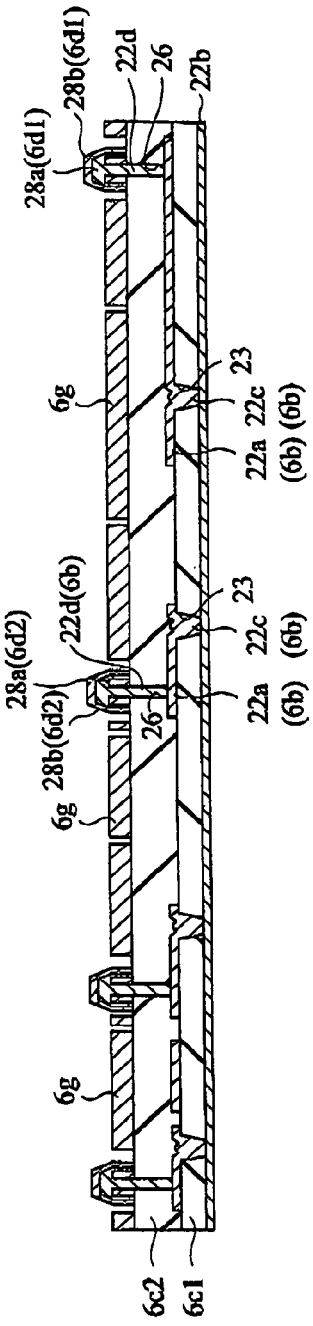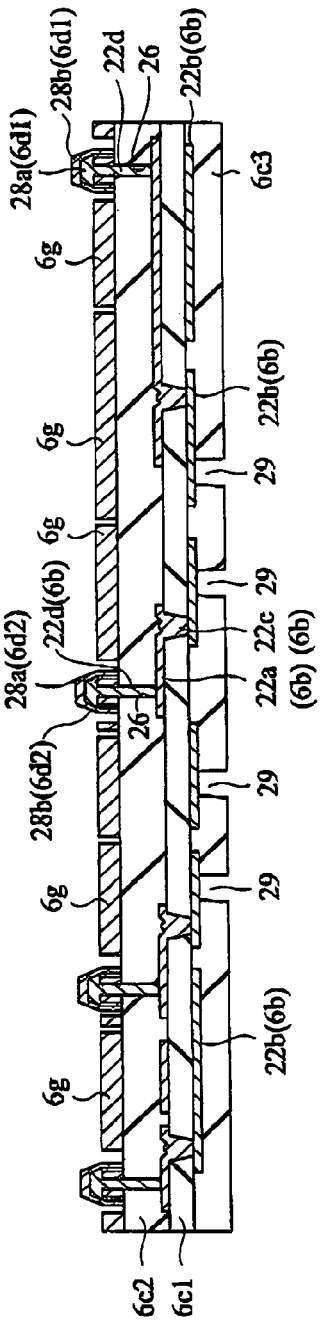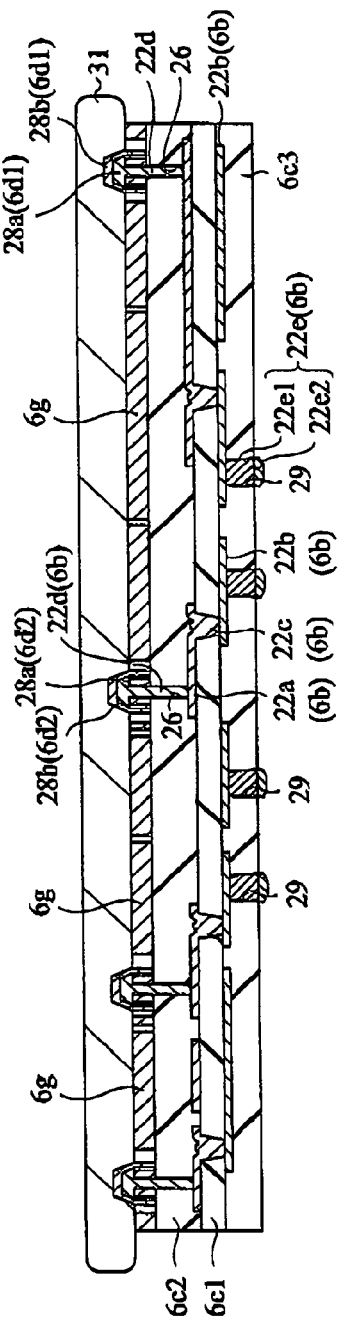

SEMICONDUCTOR INSPECTION APPARATUS AND MANUFACTURING METHOD OF SEMICONDUCTOR DEVICE

CROSS-REFERENCE TO RELATED APPLICATION

The present application claims priority from Japanese Patent Application No. JP 2004-378504 filed on Dec. 28, 2004, the content of which is hereby incorporated by reference into this application.

TECHNICAL FIELD OF THE INVENTION

The present invention relates to a semiconductor inspection apparatus and a manufacturing technology of a semiconductor device. More particularly, it relates to a technology effectively applied to a semiconductor inspection apparatus using a probe sheet and a manufacturing method of a semiconductor device using the semiconductor inspection apparatus.

BACKGROUND OF THE INVENTION

As the manufacturing technologies of semiconductor devices, the following technologies are known.

For example, in the manufacturing process of a semiconductor device, after forming semiconductor circuits on a wafer, an assembly step is carried out, through which products such as packaged products, bare chips, and CSPs (Chip Size Packages) which are typical shipping forms of semiconductor devices are formed. Inspections performed in the manufacturing process of such semiconductor devices are roughly sorted into the following three inspections. First is wafer inspection for checking the conduction state and the electrical signal operating state of semiconductor elements, which is performed in a wafer state in which semiconductor circuits and electrodes are formed on a wafer. Second is burn-in test in which semiconductor elements are placed in a high-temperature state so as to eliminate unstable semiconductor elements. Third is sorting inspection for checking the product performance before shipping the semiconductor devices.

Numerous semiconductor devices (chips) are provided on the surface of such a wafer, and are individually separated and then used. Numerous electrodes are arranged on the surface of the individually separated semiconductor devices. In order to inspect the electrical properties of such semiconductor devices mass-produced industrially, a connecting device comprising probes formed of tungsten needles obliquely projecting from a probe card (hereinafter, referred to as Conventional Technology 1) has been employed. Inspections by use of the connecting device employ a method in which contact is achieved by scratching the electrodes with the contact pressure utilizing flexibility of the probes and then the electrical properties thereof are inspected.

Also, as another conventional technology, for example, the technology described in Japanese Patent Application Laid-Open Publication No. 7-283280 (Patent Document 1) is known. This document discloses an inspection system as follows. That is, contact terminals which are formed from the holes used as molds formed by anisotropic etching of silicon are formed on the wiring on a flexible insulating film, and a probe sheet fixing substrate in which a buffer layer is interposed and fixed on the rear surface side of the contact terminal forming surface of the insulating film is overlapped on a wafer support substrate in which the wafer on which the semiconductor devices to be inspected are formed is fixed in a wafer-shaped groove of the wafer support substrate. By doing so, the tip surfaces of the contact terminal group are brought into contact with the surfaces of the electrode group of the wafer to achieve the electrical connection and then inspect the semiconductor devices.

Furthermore, as another conventional technology, for example, the technology described in Japanese Patent Application Laid-Open Publication No. 11-135582 is known. This document discloses a burn-in wafer cassette as follows. That is, a probe sheet including bumps which penetrate polyimide resin and serve as contact terminals, wiring board in contact with the sheet via anisotropic conductive rubber on the rear surface thereof, and a wafer tray on which the wafer is placed are sealed with a circular sealing member provided outside the wafer mounting part, and the pressure of the space between the wiring board and the wafer tray sealed by the sealing member is reduced. By doing so, the tip surfaces of the contact terminal group of the probe sheet are brought into contact with the surfaces of the electrode group of the wafer to achieve the electrical connection and then the semiconductor devices are inspected.

SUMMARY OF THE INVENTION

However, the inventor of the present invention has found that the above-described manufacturing technologies of semiconductor devices involve the following problems.

For example, in the above-described Conventional Technology 1, contacted materials such as aluminum electrodes or solder electrodes on the surface of which oxide is formed are used, and the probes formed of tungsten needles (contact terminals) are rubbed on the electrodes. By doing so, the oxide on the electrode material surface is removed by scratching, and the probes are brought into contact with the metal conductive material below the surface. As a result, scratching the electrode with the contact terminals generates dusts of the electrode material, and causes short-circuit in the wirings and generation of foreign substances. Moreover, since contact is achieved by scratching the electrodes with the probes while applying a load of several hundred mN or more to the electrodes, the electrodes are often damaged. In addition, at the time of the wire bonding or formation of connection bumps to be performed on the electrodes after the probing, rough electrode surface causes connection failure. As a result, the reliability is degraded.

Moreover, in the inspection process using such a probe card, since the disposal of probes has spatial limit, the probe card cannot deal with the density increase and narrower pitches of electrode pads for inspection of semiconductor devices, the increase in the number of electrode pads, and the positional accuracy of the probe tips in a large area. Moreover, in the above-described probing method, bare probe length is long due to the shape and relative arrangement of the probes, cross talk occurs, and the waveforms are disturbed when high-speed signals are used. Therefore, accurate inspection cannot be performed. More specifically, it becomes impossible to deal with the inspection of semiconductor devices in which signal processing speed is increasing more and more in the future.

On the other hand, in the above-described Patent Document 1, since the contact terminals are formed by using the holes formed by etching, the terminals can accurately correspond to the electrode arrangement of the semiconductor elements formed at arbitrary pitches. Therefore, there is no problem in the inspection of one of the semiconductor elements of the wafer by this structure. However, it is difficult to handle the case when a plurality of semiconductor elements in a wafer state are to be simultaneously inspected at one time, because electronic components (resistances, capacitors, fuses, and others) for inspection circuits have to be mounted as close as possible to each of the semiconductor elements. Moreover, since the area is increased, it is strongly required to ensure the positional accuracy which is affected by contraction/expansion of the constituent members during fabrication of the probe sheet, and positional accuracy of the tips of the contact terminals which is affected by, for example, difference in linear expansion coefficient of the constituent members (probe sheet and silicon wafer) due to temperature difference in inspection. In addition, this technology has a problem that fine adjustment of the applied load is difficult since contact pressure load is controlled only by applying the pressure to the buffer layer.

On the other hand, in the above-described Patent Document 2, since the contact terminals are formed of conventional hemispherical plating bumps, it is difficult to stabilize the contact resistance value with respect to the electrodes of the semiconductor elements, and the uniformity in height of tips is difficult to be ensured in a large area. In addition, the fine adjustment of the applied load is difficult since the contact pressure load is controlled through the elasticity of the anisotropic conductive rubber serving as a conductor located at the back of the contact terminals. Furthermore, since the pitch with which the anisotropic conductive rubber can be fabricated limits the pitches of the contact terminals, it is difficult to form a narrow-pitch probe card in which contact resistance values are stable and the wiring resistance values are low.

As described above, any of the technologies do not provide satisfactory considerations in terms of realizing simple-structure inspection methods, in which positional accuracy of the contact terminal tips is ensured without damaging the target to be inspected and the contact terminals and the contact resistance values are stable at low load in the multi-pin probing which can simultaneously inspect a wafer with a large area, on which a plurality of semiconductor elements are formed, at one time.

Moreover, along with the recent efficiency improvement in the semiconductor element inspection process, the technology for the simultaneous inspection of numerous semiconductor elements (chips) has been developed, and full-wafer inspection for ultimately inspecting chips on the entire wafer at one time has been desired. In addition, operation tests at high/low temperatures (for example, −50° C. to 150° C.) for more clearly checking and ensuring the reliability have been performed. Therefore, the inspection apparatus that can deal with them has been desired.

An object of the present invention is to provide technologies which can ensure the positional accuracy of the tips of contact terminals and can inspect a plurality semiconductor elements formed on a wafer at one time with stable contact resistance values.

Another object of the present invention is to provide a structure in which electronic components for inspection circuits can be mounted in the vicinity of contact terminals and to provide technologies which can improve the electrical properties and reliability.

Still another object of the present invention is to provide technologies which can reduce the overall manufacturing cost of semiconductor devices by improving assembly performance of a probe sheet on which contact terminals are formed, simplifying procedures and operations of inspection process, and reducing the assembly cost of the inspection apparatus to reduce the cost of inspection process of semiconductor devices.

The features of the present invention will become apparent from the description of the specification and appended drawings.

The representative ones of the inventions disclosed in this application will be briefly described as follows.

In an aspect of the present invention, by reducing the pressure of the space formed between the probe sheet and the target to be inspected facing to each other, the target to be inspected is mainly deformed to bring the contact terminals of the probe sheet into contact with electrodes of the target to be inspected. In this state, plural circuit units of the target to be inspected are electrically inspected.

Also, the present invention provides a semiconductor inspection apparatus comprising: (a) a support member supporting a semiconductor wafer having a first principal surface and a second principal surface which is on the other side of the first principal surface, a plurality of semiconductor chips formed on the first principal surface, and a plurality of electrodes disposed on each of the plurality of semiconductor chips; (b) a probe sheet having a third principal surface facing the first principal surface of the semiconductor wafer with a desired space provided therebetween, a fourth principal surface which is on the other side of the third principal surface, a plurality of contact terminals disposed on the third principal surface, a plurality of wirings respectively led from the plurality of contact terminals, and a plurality of lead electrodes led to the fourth principal surface via the plurality of wirings; (c) a tester connected to the plurality of lead electrodes of the probe sheet and electrically inspecting the plurality of semiconductor chips of the semiconductor wafer at one time; and (d) pressure reducing means for reducing the pressure of the desired space in the inspection so that the semiconductor wafer is mainly deformed to bring the plurality of electrodes of the plurality of semiconductor chips of the semiconductor wafer into contact with the plurality of contact terminals of the probe sheet.

Also, the present invention provides a manufacturing method of a semiconductor device comprising: (a) a step of preparing a semiconductor wafer having a first principal surface and a second principal surface which is on the other side of the first principal surface; (b) a step of forming a plurality of semiconductor chips on the first principal surface of the semiconductor wafer; and (c) a step of electrically inspecting the plurality of semiconductor chips of the semiconductor wafer by using a semiconductor inspection apparatus, wherein the semiconductor inspection apparatus includes: a support member supporting the semiconductor wafer; a probe sheet having a third principal surface facing the first principal surface of the semiconductor wafer with desired space provided therebetween, a fourth principal surface which is on the other side of the third principal surface, a plurality of contact terminals disposed on the third principal surface, a plurality of wirings respectively led from the plurality of contact terminals, and a plurality of lead electrodes led to the fourth principal surface via the plurality of wirings; a tester connected to the plurality of lead electrodes of the probe sheet and electrically inspecting the plurality of semiconductor chips of the semiconductor wafer at one time; and pressure reducing means for reducing the pressure of the desired space, and in the inspection of the step (c), the plurality of electrodes of the plurality of semiconductor chips of the semiconductor wafer are brought into contact with the plurality of contact terminals of the probe sheet by mainly deforming the semiconductor wafer by reducing the pressure of the desired space by using the pressure reducing means, and in this state, the plurality of semiconductor chips are electrically inspected at one time.

In another aspect of the present invention, a member having a difference in linear expansion coefficient from the semiconductor wafer smaller than the difference in linear expansion coefficient between the insulating layers mutually insulating the plurality of wirings of the probe sheet and the semiconductor wafer is provided on the fourth principal surface of the probe sheet.

In another aspect of the present invention, an electronic component which is in contact with and electrically connected to a desired lead electrode among the plurality of lead electrodes of the probe sheet is provided on the fourth principal surface side of the probe sheet.

BRIEF DESCRIPTIONS OF THE DRAWINGS

FIG. 7A is a cross-sectional view showing the formation steps of a sheet main body of a probe sheet of a probe cassette of a semiconductor inspection apparatus according to an embodiment of the present invention;

FIG. 7B is a cross-sectional view showing the formation steps of a sheet main body of a probe sheet of a probe cassette of a semiconductor inspection apparatus according to an embodiment of the present invention;

FIG. 7C is a cross-sectional view showing the formation steps of a sheet main body of a probe sheet of a probe cassette of a semiconductor inspection apparatus according to an embodiment of the present invention;

FIG. 9A is a cross-sectional view showing the formation steps of the sheet main body of the probe sheet of the probe cassette of the semiconductor inspection apparatus subsequent to FIG. 8C;

FIG. 9B is a cross-sectional view showing the formation steps of the sheet main body of the probe sheet of the probe cassette of the semiconductor inspection apparatus subsequent to FIG. 9A;

FIG. 9C is a cross-sectional view showing the formation steps of the sheet main body of the probe sheet of the probe cassette of the semiconductor inspection apparatus subsequent to FIG. 9B;

DESCRIPTIONS OF THE PREFERRED EMBODIMENTS

Hereinafter, embodiments of the present invention will be described in detail with reference to the accompanying drawings. In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, components having the same function are denoted by the same reference symbols throughout the drawings for describing the embodiments, and the repetitive description thereof is omitted.

Also, in the embodiments of the present invention, main terms are defined as follows.

Regardless of the form thereof, semiconductor devices include the devices in a wafer state in which circuits are formed (for example, a semiconductor wafer (hereinafter, simply referred to as a wafer) 1 on the left of FIG. 1), individual semiconductor elements (for example, the semiconductor chip (hereinafter, simply referred to as a chip) 2 on the right of FIG. 1) which are cut from a wafer, the devices obtained by dividing a wafer into a plurality of pieces, the devices packaged in a wafer state (wafer-level CSP), the devices obtained by dividing a wafer in which the devices are packaged in a wafer state into a plurality of pieces, and the devices obtained by cutting the wafer in which the devices are packaged in a wafer state into individual semiconductor elements (CSP: Chip Size Packages).

Figure 1:
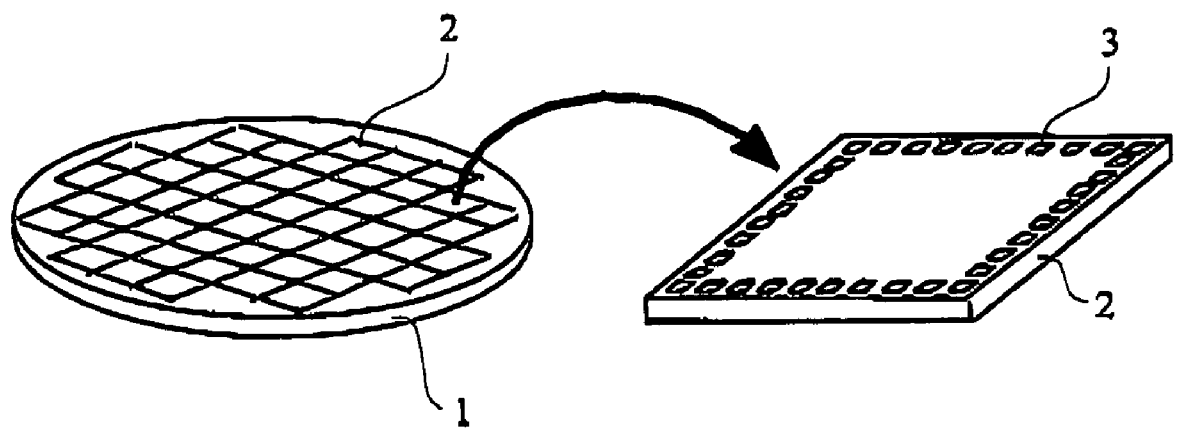
FIG. 1 is an explanatory view of a semiconductor wafer for forming semiconductor devices according to an embodiment of the present invention.

FIG. 1 shows an example of a target to be inspected, wherein a perspective view of the entire wafer 1 is shown on the left side and a perspective view of one of a plurality of chips 2 which is formed on the principal surface of the wafer 1 in an enlarged manner is shown on the right side. In this case, an example case of a peripheral electrode arrangement is shown, in which the planar shape of the chip 2 (plane orthogonal to the thickness direction of the chip 2) is formed into, for example, a rectangular shape, and a plurality of electrodes 3 are disposed along the outer periphery of the principal surface. However, the arrangement of the electrodes 3 is not limited to this, but includes various arrangements such as a case of an entire-surface electrode arrangement in which a plurality of electrodes are disposed across the entire surface of the principal surface of the chip 2.

A probe sheet indicates a sheet having contact terminals which come into contact with electrodes of a target to be inspected and wirings led from the contact terminals, or a sheet in which lead wirings are formed between electrodes of both surfaces.

A probe cassette indicates a structure having a function to establish the connection with an electrode of a target to be inspected so as to electrically connect a tester serving as a measurement device with the target to be inspected (for example, a structure shown in FIG. 2 described later).

Figure 3:
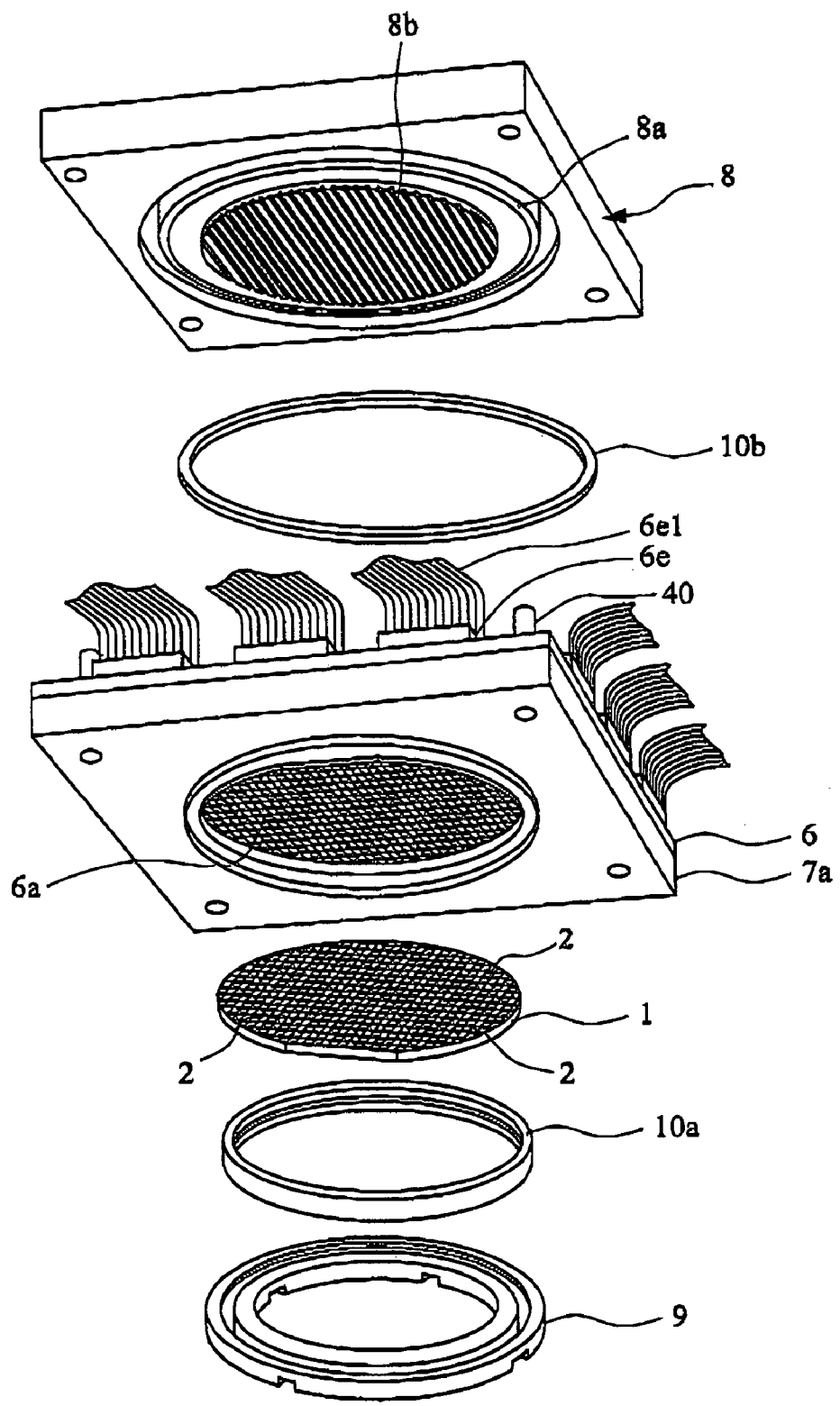
FIG. 3 is a perspective view of the main part showing main components of the probe cassette of FIG. 2 in an exploded manner.
Figure 4A:
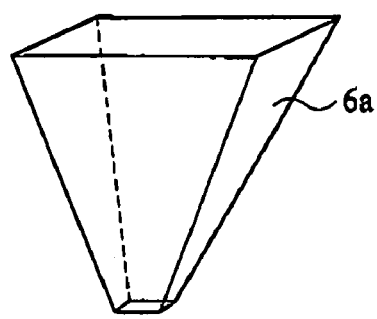
FIG. 4A is a perspective view of a main part of exemplary tip parts of contact terminals of a probe sheet of the probe cassette of FIG. 2 by which the terminals are brought into contact with the electrode of a semiconductor wafer.
Figure 4B:
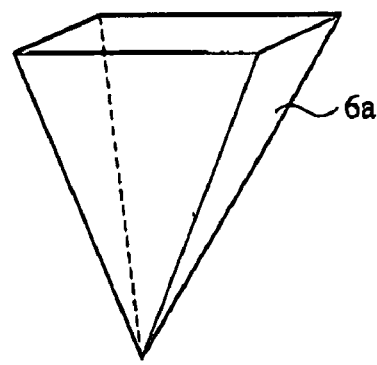
FIG. 4B is a perspective view of a main part of exemplary tip parts of contact terminals of a probe sheet of the probe cassette of FIG. 2 by which the terminals are brought into contact with the electrode of a semiconductor wafer.
Figure 5:
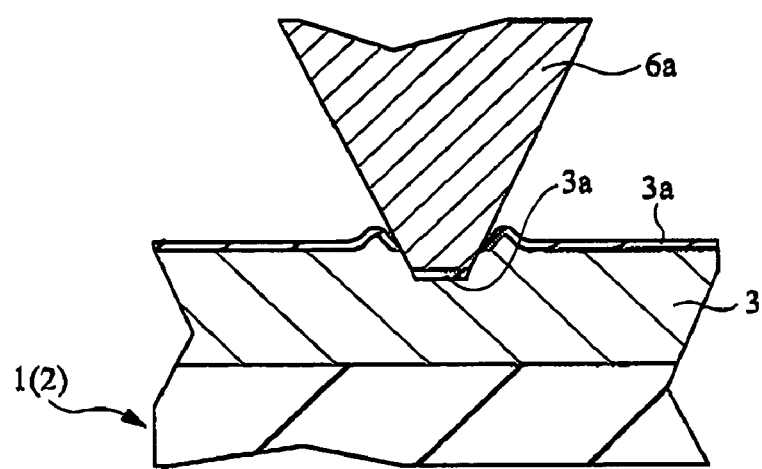
FIG. 5 is an enlarged cross-sectional view of a main part of a contacting part of the contact terminal of the probe sheet of the probe cassette of FIG. 2 and the electrode of the semiconductor wafer.

First, the structure of a probe cassette according to a typical embodiment of the present invention will be described with reference to FIG. 2 to FIG. 5. FIG. 2 is a cross-sectional view of a main part of the probe cassette according to this embodiment, FIG. 3 is a perspective view of the main part in which main components thereof are shown in an exploded manner, FIG. 4A and FIG. 4B are perspective views of a main part of exemplary tip part of contact terminals of a probe sheet of the probe cassette by which the terminals come into contact with the electrodes of a wafer, and FIG. 5 is an enlarged cross-sectional view of a main part of a contacting part of the contact terminal and the electrode of the wafer. In FIG. 4A and FIG. 4B, the contact terminals are shown in a transparent manner in order to facilitate the understanding of the outline of the tip part of the contact terminals.

The probe cassette 5 according to this embodiment is a cassette having a plurality of probes (probing needles or contact terminals) which are aligned and come into contact with electrodes 3 of chips 2 in order to measure the electrical properties of the chips 2 formed on a wafer 1. As described below, after the probe cassette 5 is set in a prober (semiconductor inspection apparatus), electrical signals are transmitted between a tester of the prober and the chips 2 of the wafer 1 so as to measure the electrical properties of the chips 2.

The probe cassette 5 has a probe sheet 6, a sheet lower-part support member 7a, a sheet upper-part support member 7b, a vacuuming support member 8, a wafer support member 9, and O rings 10a and 10b. At the outer periphery of the principal surface (third principal surface) and the rear surface (fourth principal surface) of the probe sheet 6, the sheet lower-part support member 7a and the sheet upper-part support member 7b are bonded by an adhesive respectively so as to interpose the probe sheet 6 therebetween. The sheet lower-part support member 7a and the sheet upper-part support member 7b are formed to have hardness and rigidity higher than those of the probe sheet 6, and the probe sheet 6 is firmly supported by them. Below the sheet lower-part support member 7a, the wafer support member 9 is disposed via a sealing member such as the O ring 10a. On the other hand, above the sheet upper-part support member 7b, the vacuuming support member 8 is provided via a sealing member such as the O ring 10b.

At the outer periphery of the rear surface (the surface facing the rear surface of the probe sheet 6) of the vacuuming support member 8, an external wall portion 8a which is extending along the outer periphery when viewed in a plane and protruding downward when viewed in a cross section is integrally formed. In the example shown in FIG. 2, in the central part of the rear surface of the vacuuming support member 8, that is, in the region above the region in which the group of the plurality of contact terminals 6a is disposed, a plurality of protruding portions 8b extending along the rear surface of the vacuuming support member 8 in one direction are repeatedly disposed at predetermined intervals along the direction orthogonal to the above-mentioned one direction. The protruding portions 8b are support portions (support members) for supporting the rear surface side of the probe sheet 6. The tip surfaces of the protruding portions 8b are in contact with the rear surface of the probe sheet 6. However, they are not bonded thereto. Exhaust channels 11a are formed between the plurality of adjacent protruding portions 8b. The exhaust channels 11a are connected to an exhaust channel 11b which is formed between the outer periphery of the group of the plurality of protruding portions 8b and the external wall portion 8a. The exhaust channels 11a and 11b are connected to exhaust means such as exhaust pumps via exhaust outlets 8c and valves 12. By inserting and screwing positioning pins 8d in positioning holes 8e, the vacuuming support member 8 is firmly fixed to the probe sheet 6. The example of FIG. 2 employs the arrangement in which the plurality of protruding portions 8b which are extending along the rear surface of the vacuuming support member 8 in one direction are repeatedly disposed at predetermined intervals along the direction orthogonal to the above-mentioned one direction. However, as long as the exhaust channels 11a connected to the exhaust channel 11b can be formed while supporting the rear surface side of the probe sheet 6, the protruding portions 8b may be in any arrangement, and it goes without saying that various modifications can be made in the shape and the arrangement of the protruding portions 8b within the scope of the present invention.

The probe sheet 6 is disposed so that the principal surface thereof (third principal surface) faces the principal surface of the wafer 1 (the surface on which the electrodes 3 are formed or the device forming surface on which integrated circuit elements are formed in general). On the principal surface of the probe sheet 6, a number of contact terminals (probes or probing needles) 6a equivalent to those of the plurality of chips 2 of the wafer 1 which can be measured at one time are disposed. The contact terminals 6a are conductive terminals which directly come into contact with the electrodes 3 of the wafer 1. The contact terminals 6a of the probe sheet 6 come into contact (electrically connected) with the electrodes 3 of the wafer 1 in the space 13 formed between the principal surface of the probe sheet 6 and the principal surface of the wafer 1. The tip part of the contact terminal 6a which comes into contact with the electrode 3 has, for example, a truncated pyramidal shape with diagonal edges in which the contact surface with the electrode 3 has a flat rectangular shape (see FIG. 4A), or a pyramidal shape in which the terminal end part which comes into contact with the electrode 3 is sharp (see FIG. 4B). By virtue of this, in comparison with the conventional contact mutually between hemispherical plating bumps or flat electrodes, the contact terminals 6a having a hardness penetrate the surface oxide, surface impurity, and the like of the electrodes 3 with a low contact pressure and come into contact with the genuine metal electrode material of the electrode 3. Therefore, stable contact property values can be realized. Particularly, when the shape of the tip part of the contact terminals 6a is the truncated pyramidal shape, the force applied to the electrodes 3 upon contact with the electrodes 3 is not concentrated at one point. Therefore, the destruction potential of the electrodes 3 can be reduced. In addition, when the shape of the tip part of the contact terminals 6a is the truncated pyramidal shape, a current larger than that in the case of the pyramidal shape can be caused to flow. This is because a large contact area can be ensured in the case where the tip part has a truncated pyramidal shape in comparison with the case of the pyramidal shape, since the conduction between the contact terminals 6a and the electrodes 3 is achieved when the tip part of the contact terminals 6a penetrates an oxide film 3a or the like on the surface of the electrodes 3 and slightly pierces into the electrodes 3 and the side surfaces of the tip part and the tip part thereof come into contact with the inner surfaces of the concavities formed on the upper surface of the electrodes 3 as shown in FIG. 5. Such contact terminals 6a are formed by later-described photolithography technologies (a series of processing technologies including a step of forming a photoresist pattern and an etching step using it as an etching mask). Therefore, the contact terminals 6a can correspond to (contact) the fine electrodes 3 of the wafer 1. The constituent materials and the formation method of the contact terminals 6a will be described later.

Lead wirings 6b electrically connected to the plurality of contact terminals 6a to lead them and an insulating layer 6c for insulating the lead wirings 6b from adjacent wirings are formed between the principal surface of the probe sheet 6 and the rear surface (fourth principal surface) on the other side thereof. The lead wirings 6b are made of a metal such as copper (Cu), and the insulating layer 6c is made of an insulating material having flexibility such as a polyimide resin. In this case, the example in which the lead wirings 6b have a two-layered wiring structure is shown. This wiring structure including the lead wirings 6b and the insulating layer 6c has flexibility.

A plurality of lead electrodes 6d1 and 6d2 which are electrically connected to and led by the plurality of lead wirings 6b are disposed on the rear surface (fourth principal surface) of the probe sheet 6. The lead electrodes 6d1 and 6d2 are made of a metal such as copper. The lead electrodes 6d1 are disposed on the outer periphery (outer periphery of the vacuuming support member 8) of the rear surface of the probe sheet 6. Connectors 6e for connecting external wirings are electrically connected to the lead electrodes 6d1. The connectors 6e are electrically connected to the tester of the later-described semiconductor inspection apparatus through cables 6e1 for the connectors. The other lead electrodes 6d2 are disposed at the center of the rear surface of the probe sheet 6, that is, above the region in which the plurality of the contact terminals 6a are disposed. Electronic components 6f for inspection circuits are electrically connected to the lead electrodes 6d2. The electronic components 6f are elements such as resistances, capacitors, and fuses. In this embodiment, the electronic components 6f are disposed at the positions above the contact terminals 6a and comparatively close to the contact terminals 6a in the rear surface of the probe sheet 6. Consequently, the wiring paths between the contact terminals 6a and the electronic components 6f can be shortened, and the wiring resistance and the parasitic inductance can be reduced. Therefore, it is possible to respond to the improvement in the operating speed of the integrated circuits formed on the chips 2 of the wafer 1. Moreover, as a result of disposing the fuses used as the electronic components 6f close to the contact terminals 6a, a large current which flows due to the presence of a defective chip 2 in the inspection can be quickly shut off by the blowout of the fuse or the like. Therefore it is possible to suppress or prevent the damage on the chips 2 around the defective chip 2.

In addition, a metal layer 6g is bonded on the rear surface (fourth principal surface) of the probe sheet 6. In this embodiment, the metal layer 6g is disposed on the almost entire surface while avoiding the region in which the connectors 6e and the electronic components 6f are disposed. Consequently, the structure is realized, which can ensure the positional accuracy of the group of the contact terminals 6a and can carry out copying operation while keeping the portion that is backed by the metal layer 6g at a slight angle of the principal surface of the wafer 1 to be contacted. More specifically, by backing the plurality of contact terminals 6a by the metal layer 6g, it is possible to prevent an unnecessary force from being applied, in an inspection operation, to the region in which the contact terminals 6a are formed and to improve the positional accuracy of the contact terminals 6a and the electrodes 3 of the wafer 1. Therefore, accurate contact between the contact terminals 6a and the electrodes 3 can be realized.

In addition, when a material having a linear expansion coefficient approximately equal to that of a silicon wafer such as 42 alloy (Fe-42Ni alloy) or invar is used as the constituent material of the metal layer 6g, the layer approximately coincides with the wafer 1, and the positional accuracy of the tips of the contact terminals 6a which are disposed in a large area can be ensured even at a high temperature or a low temperature. Along with the increase in the diameter of the wafer 1, the problem that the wafer 1 or the probe sheet 6 is warped due to thermal stress caused by difference in the linear expansion coefficients between the wafer 1 and the probe sheet 6 (particularly, the polyimide resin of the insulating layers 6c) and the positions of the electrodes 3 of the wafer 1 and the contact terminals 6a of the probe sheet 6 are misaligned, becomes notable. Therefore, the above-described structure is a particularly important technology when the plurality of chips 2 of the wafer 1 are simultaneously inspected at one time. Thus, in this embodiment, even when the contact region has a large area, contact between the group of the contact terminals 6a of the probe sheet 6 and the group of the electrodes 3 of the plurality of chips 2 of the wafer 1 can be readily realized with high positional accuracy of the tips.

In addition, by providing the metal layer 6g, the strength of the probe sheet 6 can be ensured, and the positional accuracy of the lead electrodes 6d1 and 6d2 which are re-wired from the contact terminals 6a via the lead wirings 6b can be ensured. Therefore, the manipulation of the probe cassette 5 in assembly can be facilitated. In addition, since holes 6h for positioning and screw insertion which have the accurate positional accuracy and shapes are formed in the metal layer 6g by a batch etching process using photolithomask, positioning in the assembly process is facilitated, and the assembly process itself is also facilitated.

However, although the case where the metal layer 6g is provided on the almost entire surface of the rear surface of the probe sheet 6 has been described, the structure is not limited to this. For example, the metal layer 6g may be provided at the outer periphery of the rear surface of the probe sheet 6 so as to individually surround the group of the plurality of contact terminals 6a. In this case, the region in the probe sheet 6 in which the metal layer 6g is not provided, that is, the region in which the group of the plurality of contact terminals 6a is disposed has plasticity (flexibility) higher than the above-described case. In this case, although effects of thermal stress and strength are slightly lower than the above-described structure in which the metal layer 6g is provided on the almost entire surface, the effects similar to those of the above-described structure can be obtained.

In addition, a plurality of holes 6i penetrating the principal surface and the rear surface thereof are formed in the probe sheet 6. The holes 6i are exhaust channels connecting the space 13 with the exhaust channels 11a and 11b on the rear surface side of the probe sheet 6. The holes 6i are disposed in a distributed manner so that the principal surface of the wafer 1 can be sucked approximately uniformly, and are disposed at the positions corresponding to the individual chips 2 on the principal surface of the wafer 1 in addition to the positions corresponding to the outer peripheral region of the principal surface of the wafer 1.

Such a probe sheet 6 is installed in an attachable/detachable state and can be replaced in accordance with, for example, types of later-described various inspection steps of the manufacturing process of semiconductor devices, the types of integrated circuits formed on the chips 2 of the wafer 1, and differences in arrangement or adjacent pitches of the electrodes 3. More specifically, the probe sheet 6 can be modified in accordance with the above-described changes.

In such a probe cassette 5, the principal surface of the wafer 1 on which the plurality of chips 2 are formed is directed to the principal surface (the surface on which the contact terminals 6a are formed) of the probe sheet 6, and the wafer is placed on the wafer support member 9 so that the outer peripheral part of the wafer 1 is in contact with the O ring 10a. Thereafter, the air in the space 13 formed between the principal surface of the wafer 1 and the principal surface of the probe sheet 6 is exhausted through the holes 6i, the exhaust channels 11a and 11b, and the exhaust outlets 8c by the above-mentioned exhaust pumps, thereby reducing the air pressure in the space 13 from the pressure before starting the inspection. Consequently, the wafer 1 is mainly sucked toward the side of the principal surface of the probe sheet 6, and the wafer 1 is deformed (warped). The probe sheet 6 is also deformed (warped) slightly so as to be attracted toward the principal surface side of the wafer 1. As a result, the electrodes 3 of the plurality of chips 2 on the principal surface of the wafer 1 are brought into contact with the plurality of contact terminals 6a on the principal surface of the probe sheet 6 with an approximately uniform pressure and at a high positioning accuracy. Accordingly, the electrical properties of the plurality of chips 2 of the wafer 1 can be measured at one time. When the pressure applied from the contact terminals 6a to the electrodes 3 becomes excessive, the probe sheet 6 is deformed or the insulating layers 6c made of a resin such as polyimide resin is slightly deformed. By doing so, fine adjustment is performed so that the pressure applied to the electrodes 3 does not become excessive. Therefore, damage, destruction and the like of the contact terminals 6a and the electrodes 3 can be suppressed or prevented. Moreover, it is predicted that the wiring layers of the probe sheet 6 are multiplied along with improvement of the performance of semiconductor devices and the probe sheet 6 has a structure that is hard to be bent in the future. In this embodiment, however, the contact terminals 6a and the electrodes 3 are not brought into contact with each other by bending the probe sheet 6 but the contact terminals 6a and the electrodes 3 are brought into contact with each other by mainly bending (deforming) the wafer 1. Therefore, it is possible to sufficiently respond to the multiplication of the wiring layers of the probe sheet 6 due to improvement of the performance of semiconductor devices. Furthermore, from this point of view, a comparatively hard material such as a printed wiring board, a glass substrate, or a ceramic substrate may be used as a constituent material of the probe sheet 6. These substrates can improve the readiness of production and assembly of the probe cassette 5 since they have higher hardness and rigidity in comparison with a substrate using a polyimide resin as an insulating material and the strength thereof is high. Details of the above-described inspection will be described later.

Next, an example of a forming method of the above-described contact terminals 6a will be described with reference to FIG. 6A to FIG. 6C.

Figure 6A:
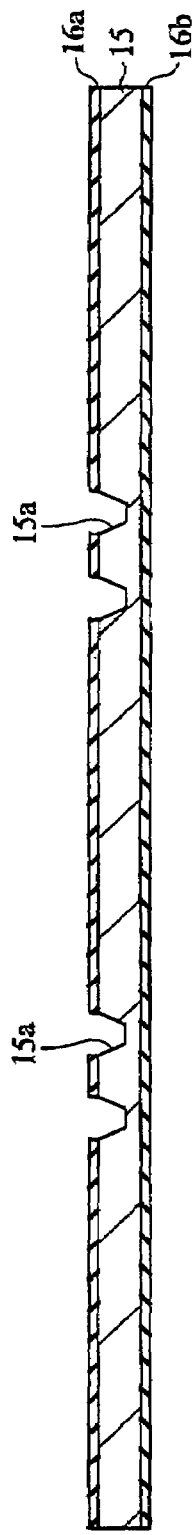
FIG. 6A is a cross-sectional view showing the formation steps of contact terminals of a probe sheet of a probe cassette of a semiconductor inspection apparatus according to an embodiment of the present invention.

First, as shown in FIG. 6A, insulating films 16a and 16b such as silicon dioxide films with a thickness of about 0.5 μm are formed by the thermal oxidation on both sides of a (100) plane of a wafer 15 made of silicon or the like with a thickness of, for example, 0.2 to 0.6 mm which is a mold material for forming the contact terminals. Subsequently, a photoresist is applied onto the insulating film 16a of the principal surface of the wafer 15, and a pattern in which the portions of the photoresist at which truncated pyramid shaped holes are to be formed are removed is formed by a photolithography process. Thereafter, portions of the insulating film 16a are removed by the etching using a mixture of hydrofluoric acid and ammonium fluoride, with using the photoresist as an etching mask. Then, after the photoresist is removed, with using the remaining insulating film 16a as an etching mask, the silicon exposed from the insulating film 16a is anisotropically etched by a strong alkaline solution (for example, potassium hydroxide). By doing so, truncated pyramidal etching holes 15a which are surrounded by the side surfaces of a (111) plane are formed.

In this case, the wafer 15 is used as a mold material. However, any other material can be used as long as the mold material has crystallinity, and it goes without saying that various modifications can be made within the scope of the present invention. Moreover, although the holes formed by anisotropic etching are truncated pyramidal, the shape may be pyramidal, and various modifications can be made thereto as long as the contact terminals 6a which can ensure stable contact resistance with a low probing pressure can be formed by the shape. Moreover, it goes without saying that a plurality of the contact terminals 6a may be brought into contact with one electrode 3 which is a contact target.

Figure 6B:
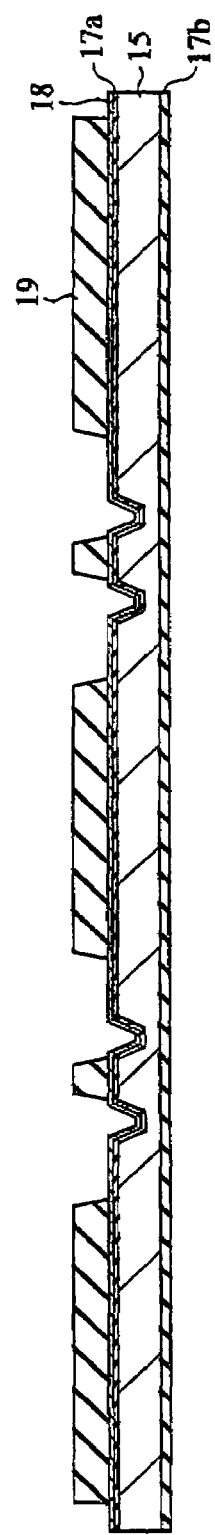
FIG. 6B is a cross-sectional view showing the formation steps of contact terminals of a probe sheet of a probe cassette of a semiconductor inspection apparatus according to an embodiment of the present invention.

Subsequently, as shown in FIG. 6B, the insulating film 16a used as the etching mask is removed by etching using a mixture of hydrofluoric acid and ammonium fluoride, and the entire surface of the wafer 15 is thermally oxidized again in wet oxygen, thereby forming insulating films 17a and 17b such as silicon dioxide films having a thickness of about 0.5 μm on both surfaces of the wafer 15a. Subsequently, after a conductive coating film 18 is formed on the surface of the insulating film 17a, a dry film 19 is formed on the surface of the conductive coating film 18, and then, portions of the dry film 19 at the positions where the contact terminals 6a and connector electrode portions are to be formed are removed. Although the dry film 19 is used herein, the photoresist mask may be a liquid resist or a film resist as long as the film has photosensitivity.

As the conductive coating film 18, for example, a film of chromium is formed by a sputtering method or a vapor deposition method so as to form a chromium film having a thickness of about 0.1 μm and when a film of copper is formed by a sputtering method or a vapor deposition method on the surface having the chromium film formed thereon so as to form a copper film having a thickness of about 1 μm.

Figure 6C:
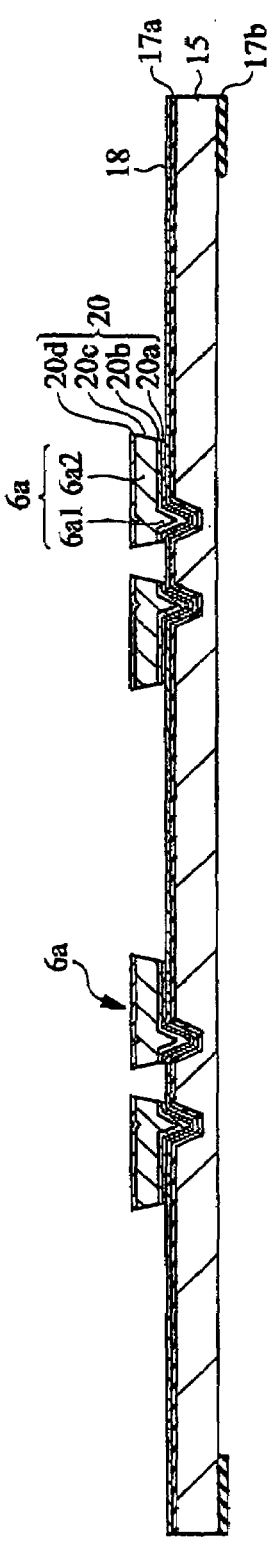
FIG. 6C is a cross-sectional view showing the formation steps of contact terminals of a probe sheet of a probe cassette of a semiconductor inspection apparatus according to an embodiment of the present invention.

Next, as shown in FIG. 6C, the conductive coating film 18 exposed through the openings of the dry film 19 is electroplated with a metal film 20 containing a material having high hardness as a primary component with using the conductive coating film 18 as an electrode. By doing so, the contact terminals 6a integrally including contact terminal tip portions 6a1 and the connector electrode portions 6a2 are formed. As the plating materials constituting the metal film 20, metal films 20a to 20d are sequentially electroplated from below. For example, the metal film 20a is made of nickel, the metal film 20b is made of rhodium, the metal film 20c is made of nickel, and the metal film 20d is made of gold. Subsequently, after the insulating film 17b on the other surface of the surface of the wafer 15 on which the contact terminals 6a are formed is removed by etching using a mixture of hydrofluoric acid and ammonium fluoride, the dry film 19 is removed.

Next, an example of the manufacturing method of the part of the wiring structure (sheet main body) of the probe sheet 6 will be described with reference to FIG. 7A to FIG. 9C.

First, as shown in FIG. 7A, a photoresist is applied onto a metal film 22a which is on one of the surfaces of an insulating layer 6c1 formed of a polyimide film having metal films 22a and 22b made of copper formed on both surfaces thereof. Subsequently, a pattern in which the portions of photoresist at which vias are to be formed are removed is formed by a photolithography process. Thereafter, portions of the metal film 22a at the via forming positions are removed by etching using an alkaline copper etching solution with using the photoresist as an etching mask, and then, the photoresist is removed.

Subsequently, as shown in FIG. 7B, holes 23 for forming vias are formed in the insulating layer 6c1 with using the remaining metal film 22a as an etching mask. As a method of forming the holes 23, portions of the insulating layer 6c1 are removed by, for example, a laser method or a dry etching method with using the metal film 22a as a mask.

Subsequently, as shown in FIG. 7C, a dry film 24 is attached to the metal film 22a of the insulating layer 6c1, and a pattern in which portions of the dry film 24 except for the portions at which the lead wirings 6b are to be formed are removed is formed by a photolithography process, and then, portions of the metal film 22a are removed by etching using an alkaline copper etching solution with using the dry film 24 as an etching mask. In this manner, a part of the lead wirings 6b is formed.

Figure 8A:
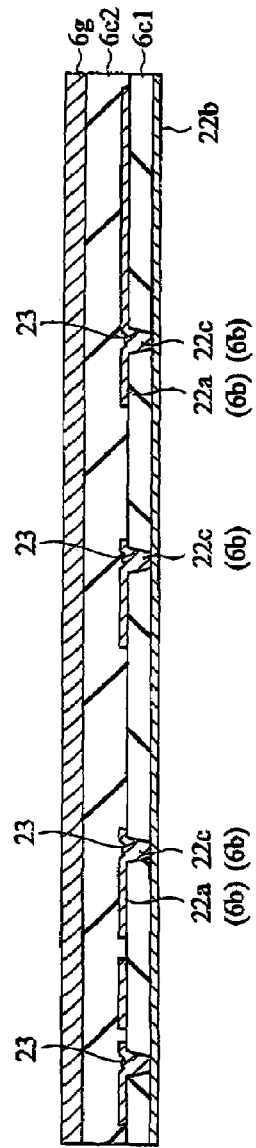
FIG. 8A is a cross-sectional view showing the formation steps of the sheet main body of the probe sheet of the probe cassette of the semiconductor inspection apparatus subsequent to FIG. 7C.

Subsequently, as shown in FIG. 8A, after the dry film 24 is removed, copper plating is performed with using the metal film 22b as a power source layer, thereby embedding metal vias 22c made of copper in the holes 23 for forming the vias. Then, an insulating layer 6c2 functioning as a bonding layer and a metal layer 6g are bonded thereto.

Here, for example, a polyimide-based bonding sheet or an epoxy-based bonding sheet can be used as the insulating layer 6c2. Also, a metal sheet having a low linear expansion coefficient and a linier expansion coefficient close to that of the silicon wafer (silicon mold material having a linier expansion coefficient of about 3 ppm/° C.) 15 such as that made of 42 alloy (alloy containing 42% of nickel and 58% of iron and having a linear expansion coefficient of 4 ppm/° C.) or invar (for example, alloy containing 36% of nickel and 64% of iron and having a linear expansion coefficient of 1.5 ppm/° C.) is used as the metal layer 6g. When the probe sheet 6 is formed by bonding the metal layer 6g via the insulating layer 6c2 onto the insulating layer 6c1 on which the lead wirings 6b are formed, the mechanical strength of the probe sheet 6 can be improved, and in addition, positional accuracy can be ensured under various conditions, for example, position misalignment due to the temperature during the inspection can be prevented. According to this purpose, in order to ensure positional accuracy in the burn-in inspection, a material having a linear expansion coefficient close to the linear expansion coefficient of the semiconductor elements to be inspected can be used for the metal layer 6g.

In the above-described bonding process, for example, the insulating layer 6c1 on which the metal vias 22c in the vias and the lead wirings 6b are formed, the insulating layer 6c2, and the metal layer 6g are sequentially stacked. In this state, heating and pressurizing bonding is performed in vacuum by applying a temperature equal to or higher than the glass transition point temperature (Tg) of the insulating layer 6c2 while pressurizing them at 10 to 200 Kgf/cm$^2$.

Figure 8B:
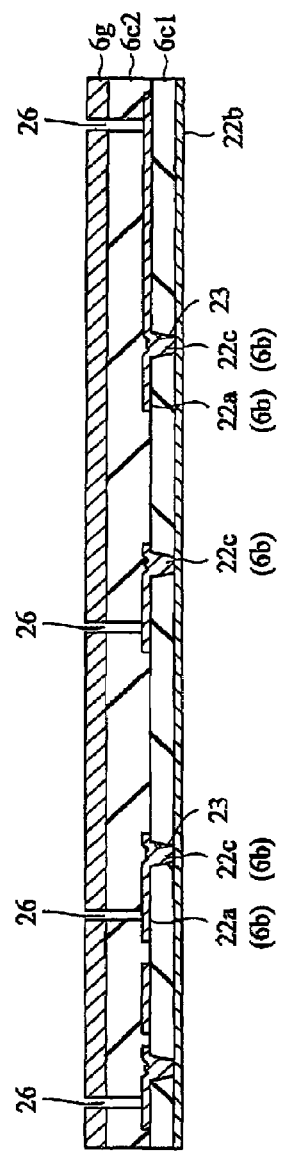
FIG. 8B is a cross-sectional view showing the formation steps of the sheet main body of the probe sheet of the probe cassette of the semiconductor inspection apparatus subsequent to FIG. 8A.

Subsequently, as shown in FIG. 8B, a photoresist is applied onto the metal layer 6g, and a pattern in which portions of the photoresist at which vias are to be formed are removed is formed by a photolithography process, and then, portions of the metal layer 6g at the via forming positions are removed by etching with using the photoresist as an etching mask. Subsequently, after the photoresist is removed, holes 26 for forming vias which reach the metal film 22a are formed in the insulating layer 6c2 with using the remaining metal layer 6g as an etching mask. When 42 alloy or invar is used as the metal layer 6g, the metal layer 6g at the via forming positions is removed by etching using a ferric chloride solution. As a method of forming holes in the insulating layer 6c2, for example, a laser method or dry etching can be used to remove the insulating layer 6c2.

Figure 8C:
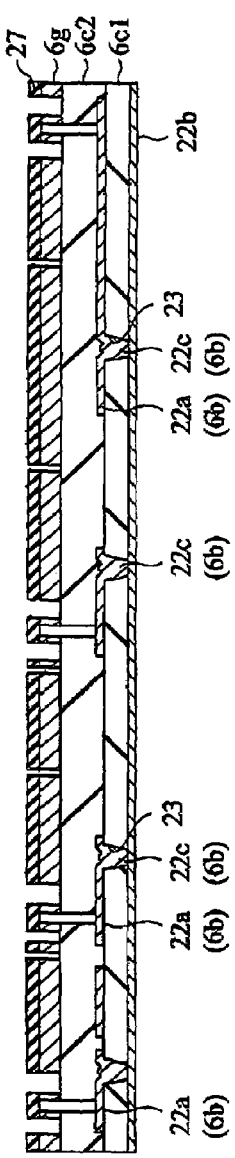
FIG. 8C is a cross-sectional view showing the formation steps of the sheet main body of the probe sheet of the probe cassette of the semiconductor inspection apparatus subsequent to FIG. 8B.

Subsequently, as shown in FIG. 8C, a dry film 27 is formed on the surface of the metal layer 6g, and then, after portions of the dry film 27 at which the metal layer 6g are to be removed are removed by exposure and development, the metal layer 6g exposed through the remaining dry film 27 which is used as an etching mask is removed by etching. Although the dry film 27 is used here, any film can be used as long as it has photosensitivity. When 42 alloy or invar is used as the metal layer 6g, the shower etching using a ferric chloride solution may be used to remove the metal film.

Then, as shown in FIG. 9A, after the dry film 27 is removed, metal vias 22d made of copper are embedded in the holes 26 for forming vias by performing copper plating with using the metal film 22b on the other surface as a power source layer, and a copper plating process is performed so as to cover a metal film (land) 28a which is formed to surround the holes 26 for forming vias. Furthermore, a gold plating process is performed to the surface thereof to form a metal film 28b. In this manner, the lead electrodes 6d1 and 6d2 are formed.

Subsequently, as shown in FIG. 9B, after a photoresist is applied onto the metal film 22b on the other surface, a photoresist pattern is formed by a photolithography process, and then, portions of the metal film 22b are removed by etching using an alkaline copper etching solution with using the photoresist as an etching mask. By doing so, the lead wirings 6b formed of the metal film 22b are formed. Subsequently, after the photoresist is removed, an insulating layer 6c3 (having a function as a bonding layer) in which via forming holes 29 are formed is bonded so as to cover the lead wirings 6b.

In this case, a polyimide-based bonding sheet in a half-cured state can be used as the insulating layer 6c3. In order to form the insulating layer 6c3 in which the via forming holes 29 are formed, for example, a polyimide-based bonding sheet which has undergone laser hole forming processing or punching hole forming processing is thermally bonded with pressure in vacuum, or a polyimide-based bonding sheet is subjected to laser hole forming processing after it is thermally bonded with pressure in vacuum.

Thereafter, as shown in FIG. 9C, a conductive sheet 31 is brought into contact with the metal film 28b for forming the lead electrodes 6d1 and 6d2 on the upper surface side, and the via forming holes 29 through which a part of the metal film 22b on the other surface side is exposed via the metal vias 22d, the metal film 22a, and the metal vias 22c are filled with metal vias 22e. In order to form the filled metal vias 22e, for example, an appropriate amount of solder plating is employed. Alternatively, it may be formed by metal vias 22e1 and 22e2 which are formed by performing the plating process to appropriate amounts of metal materials. The metal vias 22e1 are made of, for example, nickel and the metal vias 22e2 are made of, for example, solder.

Next, an example of the manufacturing method of the probe sheet 6 will be described with reference to FIG. 10 to FIG. 12.

Figure 10:
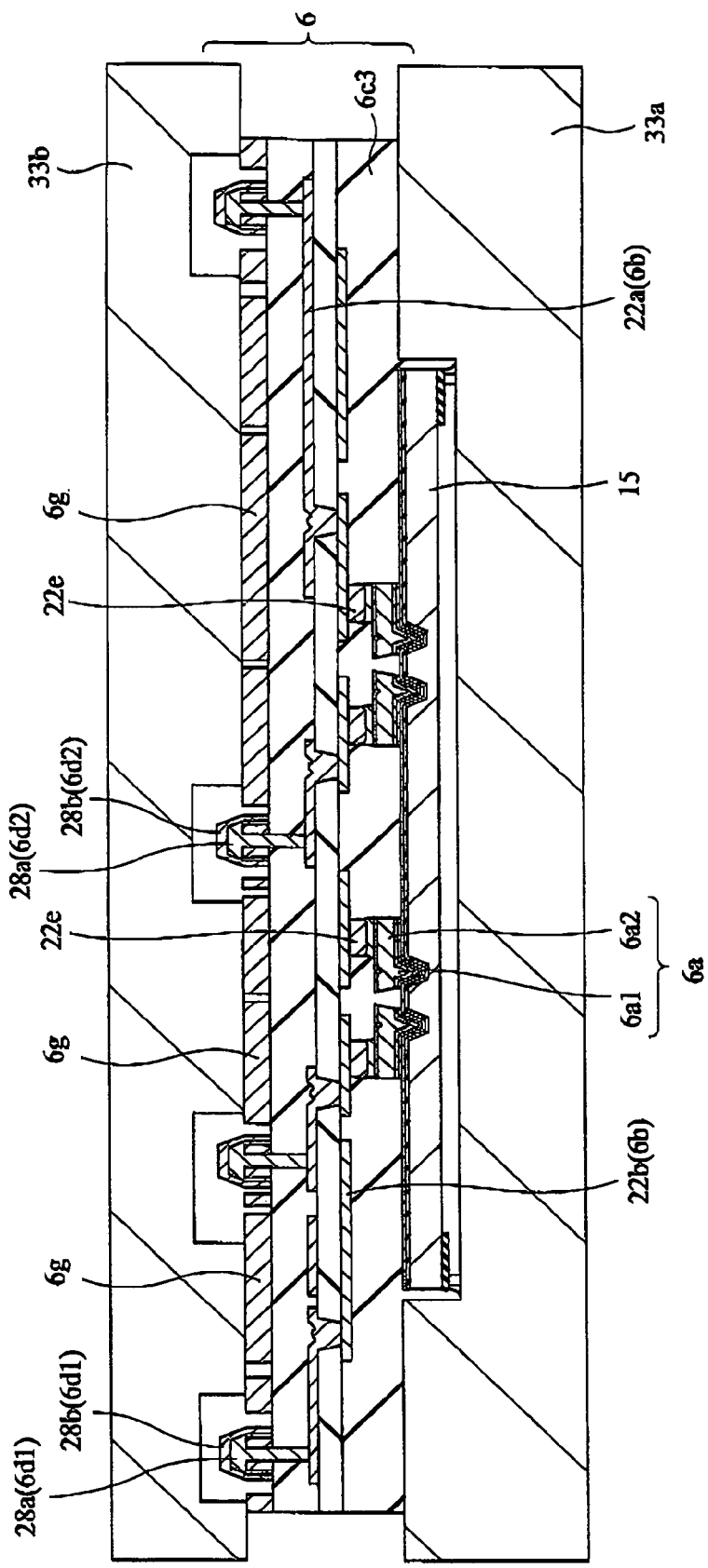
FIG. 10 is a cross-sectional view showing the manufacturing process of a probe sheet of a probe cassette of a semiconductor inspection apparatus according to an embodiment of the present invention.

First, as shown in FIG. 10, the connector electrode portions 6a2 of the contact terminals 6a formed on the wafer 15 as a mold material in above-described FIG. 6C and the metal vias 22e and the insulating layer 6c3 of the wiring sheet (wiring structure) formed in FIG. 9C are mutually connected, thereby fabricating the integrated probe sheet 6. Herein, for example, when the polyimide-based bonding sheet in a half-cured state is used as the insulating layer 6c3 having a function as a bonding layer, they are bonded by applying heat and pressure while being interposed between substrates 33a and 33b for vacuum pressurizing heating bonding in vacuum, for example, by pressurizing them at 10 to 200 Kgf/cm$^2$ and applying a temperature equal to or more than the glass transition temperature (Tg) of the insulating layer 6c3.

Figure 11:
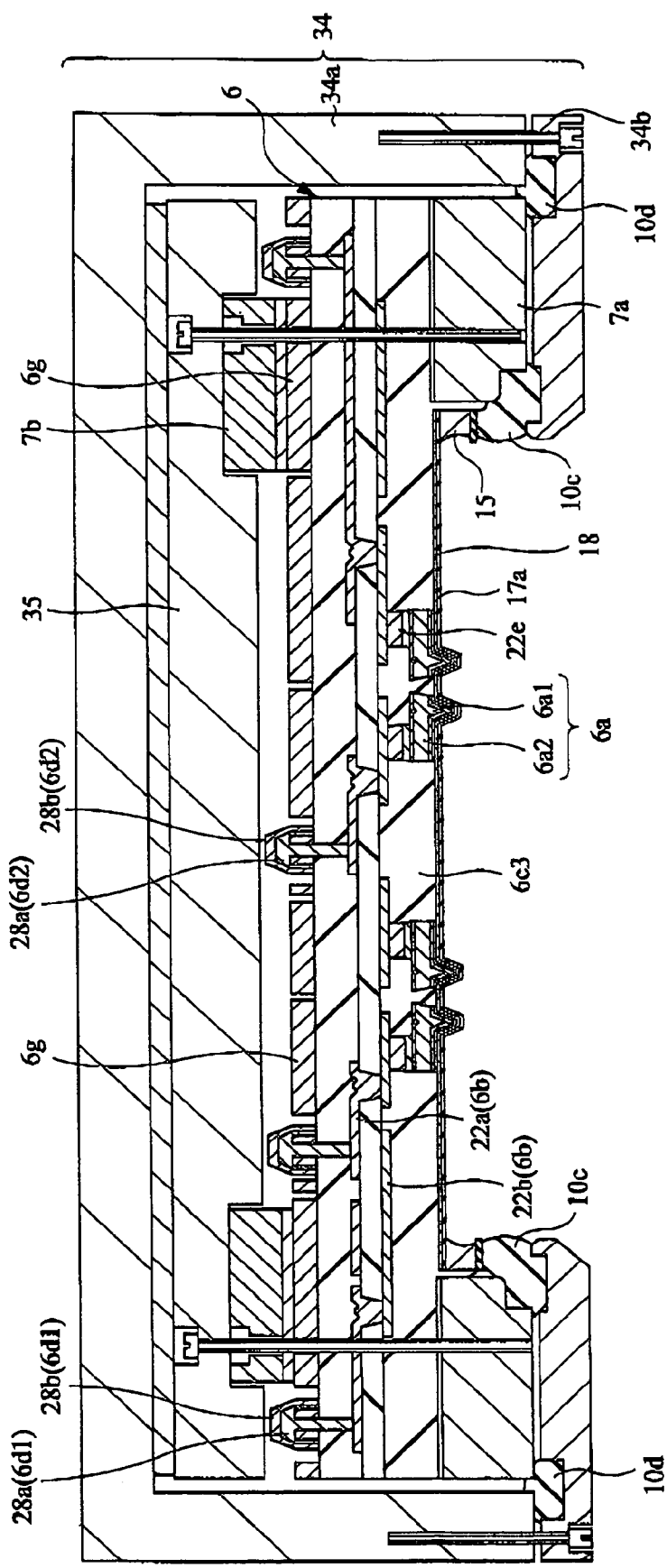
FIG. 11 is a cross-sectional view showing the manufacturing process of the probe sheet of the probe cassette of the semiconductor inspection apparatus subsequent to FIG. 10.

Subsequently, as shown in FIG. 11, the structure in which the sheet lower-part support member 7a and the sheet upper-part support member 7b are bonded and fixed to both sides of the above-described integrated probe sheet 6 is attached to a silicon-etching protection jig 34, and the silicon (i.e., the wafer 15 for a mold material) is removed by etching. For example, the sheet lower-part support member 7a is fixed to an intermediate locking plate 35 by screwing, and a stainless-steel locking jig 34a and a stainless-steel lid 34b are attached via O rings 10c and 10d. Thereafter, the wafer 15 serving as a mold material is removed by etching using a strong alkaline liquid (for example, potassium hydroxide). For example, the wafer 15 may be removed by etching in a strong alkaline liquid or the etching by spraying a strong alkaline liquid to the etching surface. At this time, the insulating film 17a formed on the principal surface of the wafer 15 as a mold material is allowed to function as an etching mask, thereby protecting the insulating layer 6c3 of the probe sheet 6 from the etching solution. Thus, the probe sheet 6 having the plurality of extremely fine contact terminals 6a can be readily fabricated.

Figure 12:
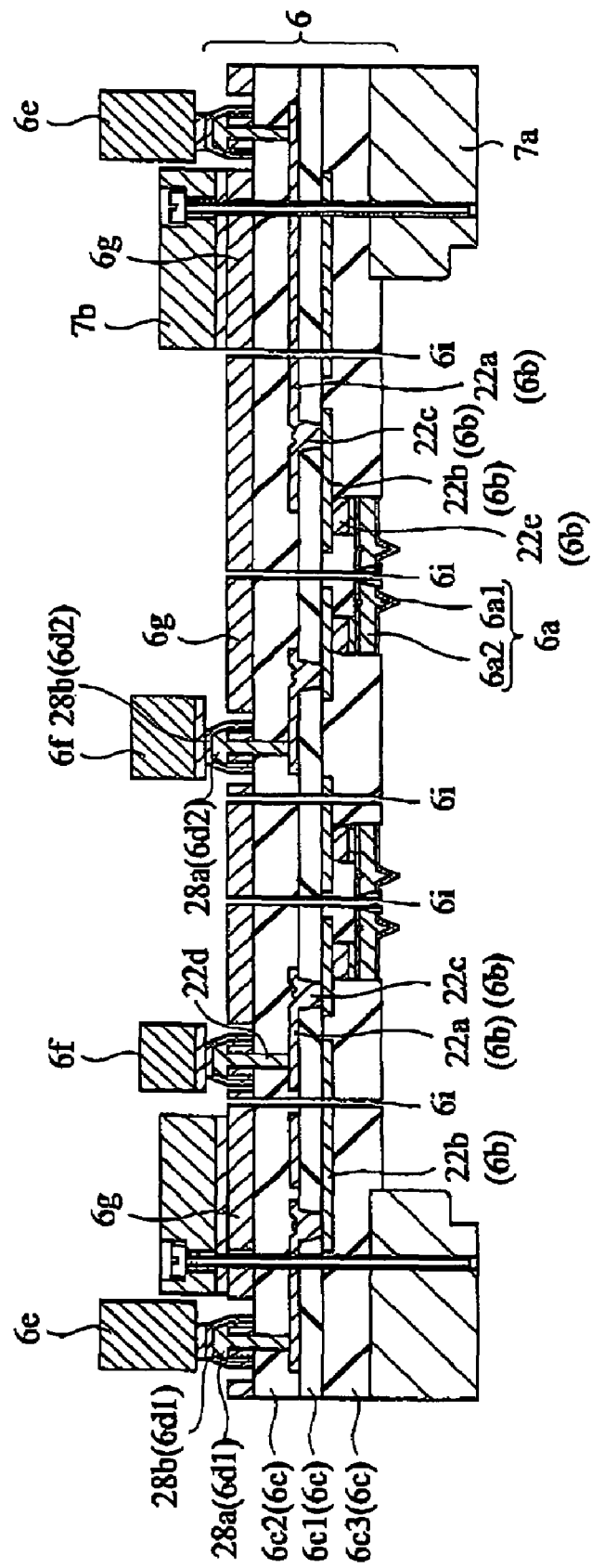
FIG. 12 is a cross-sectional view showing the manufacturing process of the probe sheet of the probe cassette of the semiconductor inspection apparatus subsequent of FIG. 11.

Subsequently, as shown in FIG. 12, after the silicon-etching protection jig 34 is detached, a protective film is bonded onto the surface of the probe sheet 6 on which the sheet upper-part support member 7b is bonded, and then, the insulating film 17a, the conductive coating film 18, and the metal film 20a are sequentially removed by etching. Thereafter, after the protective film is removed, the electronic components 6f for the inspection circuit and the connectors 6*e* for connecting external wirings are bonded and fixed on the rear surface (fourth principal surface) of the probe sheet 6.

In this case, the insulating film 17*a* is removed by etching using a mixture of hydrofluoric acid and ammonium fluoride, chromium (conductive coating film 18) is removed by etching using a potassium permanganate solution, and copper (conductive coating film 18) and nickel (metal film 20*a*) are removed by etching using an alkaline copper etching solution.

The reason why the material of the metal film 20*b* exposed on the surface of the contact terminals 6*a* as a result of the series of etching processes is rhodium is that rhodium has excellent properties to be used as the contact terminals. For example, the material of the electrodes 3 of the wafer 1 which are targets to be inspected such as solder or aluminum does not readily adheres to rhodium, and rhodium has higher hardness than nickel, and has stable contact resistance-since it is not readily oxidized.

Thereafter, when portions of the insulating layers 6*c*1 to 6*c*3 exposed through the metal layer 6*g* which is used as a mask are removed, the holes 6*i* penetrating the sheet through the principal and rear surfaces thereof are formed in the probe sheet 6. Thus, the probe sheet 6 is fabricated.

Figure 2:
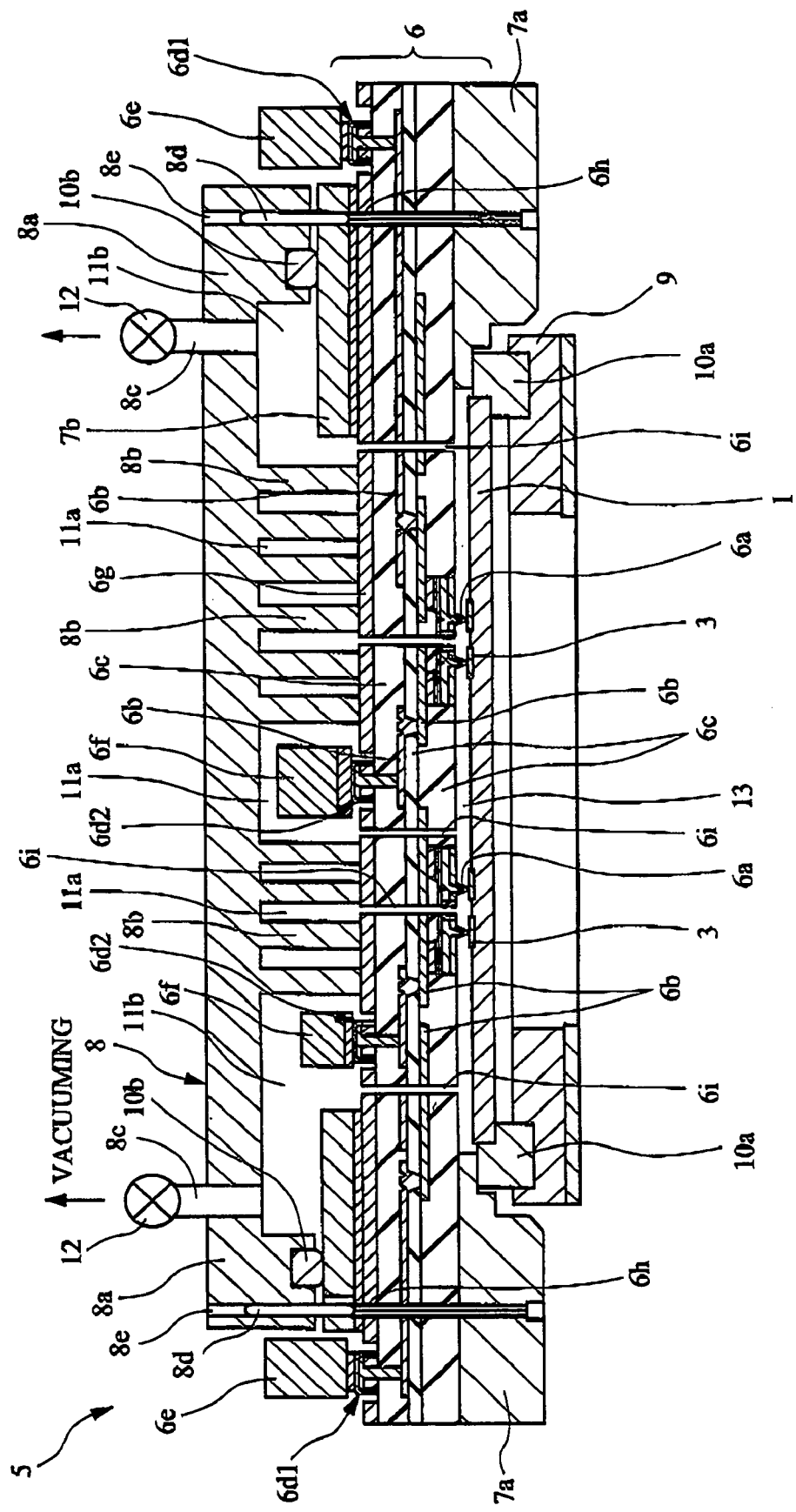
FIG. 2 is a cross-sectional view of a main part of the probe cassette of a semiconductor inspection apparatus according to an embodiment of the present invention.

Then, as shown in above-mentioned FIG. 2, the wafer 1 together with the O ring 10*a* is interposed between the sheet lower-part support member 7*a* which is bonded and fixed to the probe sheet 6 and the wafer support member 9, and the O ring 10*b* is interposed between the sheet upper-part support member 7*b* and the vacuuming support member 8. By doing so, the probe cassette 5 is formed. The probe sheet 6 is installed so that the plurality of contact terminals 6*a* on the principal surface (third principal surface) thereof are well aligned with the electrodes 3, which are formed on the principal surface of the wafer 1 for inspection.

Incidentally, when a silicon wafer having the same size as or larger than the size of the wafer 1 which is the target to be inspected is used as the wafer 15 which is the mold material for forming the contact terminals 6*a*, the entire contact terminal group can be fabricated by a singled wafer. However, it is also possible to fabricate the probe sheet from contact terminal groups which are individually formed from a plurality of wafers with using small-size wafers as the mold material.

For example, when the plurality of chips 2 of a wafer having a diameter of 200 mm are to be inspected at one time, it is also preferable that necessary parts on which the contact terminals 6*a* corresponding to a quarter area of the 200 mm wafer are formed are cut out from four wafers having a diameter of 150 mm to use them in combination.

Figure 13A:
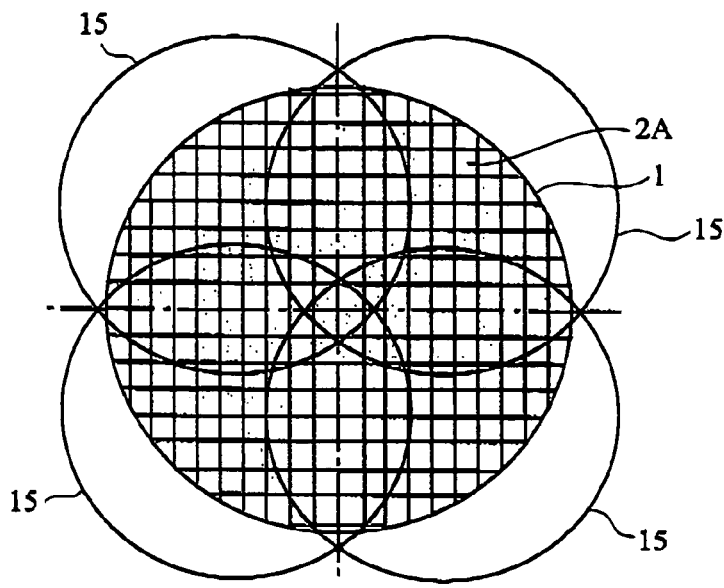
FIG. 13A is a plan view showing an example in which a semiconductor chip forming region of a semiconductor wafer to be inspected is covered by four small wafers.

A typical example is shown in FIG. 13A to FIG. 13D. FIG. 13A shows an example in which, as the wafers 15 used as mold materials for forming a group of the plurality of contact terminals 6*a* for measuring the semiconductor element forming region (region of a group of the plurality of chips 2 shown by hatching in FIG. 13A) 2A of the wafer 1 having a diameter of 200 mm, the four wafers 15 having a diameter of 150 mm are used to cover the region.

Figure 13B:
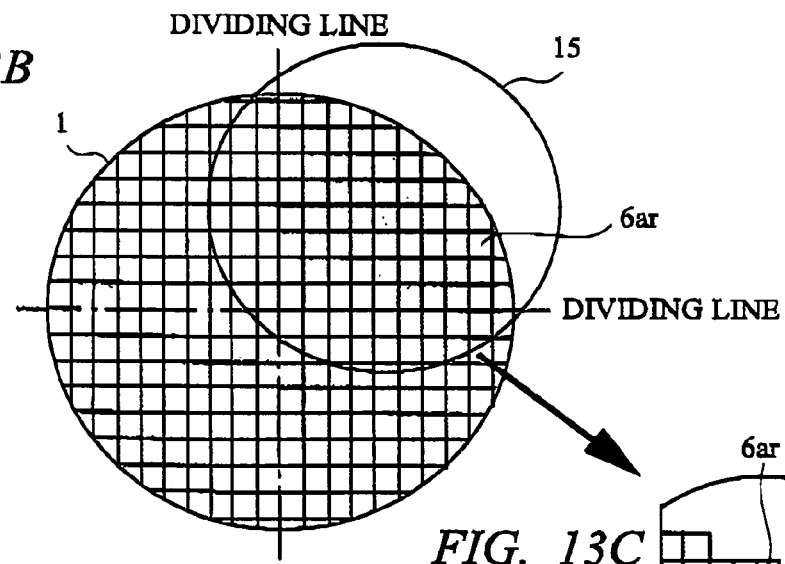
FIG. 13B is a plan view showing an example in which a quarter region of the semiconductor chip forming region of the semiconductor wafer to be inspected is formed on a small wafer.

Moreover, FIG. 13B shows an example in which a region (region shown by hatching in FIG. 13B) 6*ar* of a group of the plurality of contact terminals 6*a* for measuring the semiconductor element forming region 2A which is a quarter of the entire wafer 1 having a diameter of 200 mm is formed on the wafer 15 having a diameter of 150 mm.

Figure 13C:
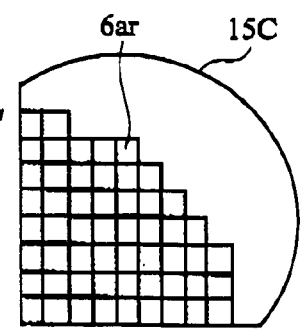
FIG. 13C is a plan view showing typical examples of cut wafers of FIG. 13B.
Figure 13D:
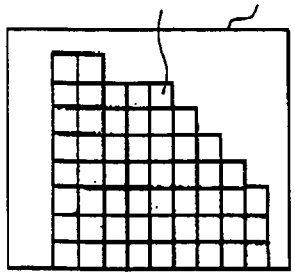
FIG. 13D is a plan view showing typical examples of cut wafers of FIG. 13B.

Furthermore, FIG. 13C and FIG. 13D are examples showing cut wafers 15C and 15D from which the overlapped portions of the wafers 15 are cut off in order to finally obtain the region capable of inspecting the semiconductor element forming region 2A by combining the cut wafers 15 in which the regions 6*ar* for forming the contact terminals 6*a* are formed.

Also, it is also possible to divide the wafer 1 so as to have a size equal to or smaller than the size of the probe cassette 5 by arbitrarily dividing the wafer 1 which is the target to be inspected in accordance to the size of the probe cassette 5, and then, the divided wafer 1 is put into the probe cassette and inspected. Consequently, the size of the inspection apparatus is not increased, and spending large equipment investment is no longer required.

Figure 14A:
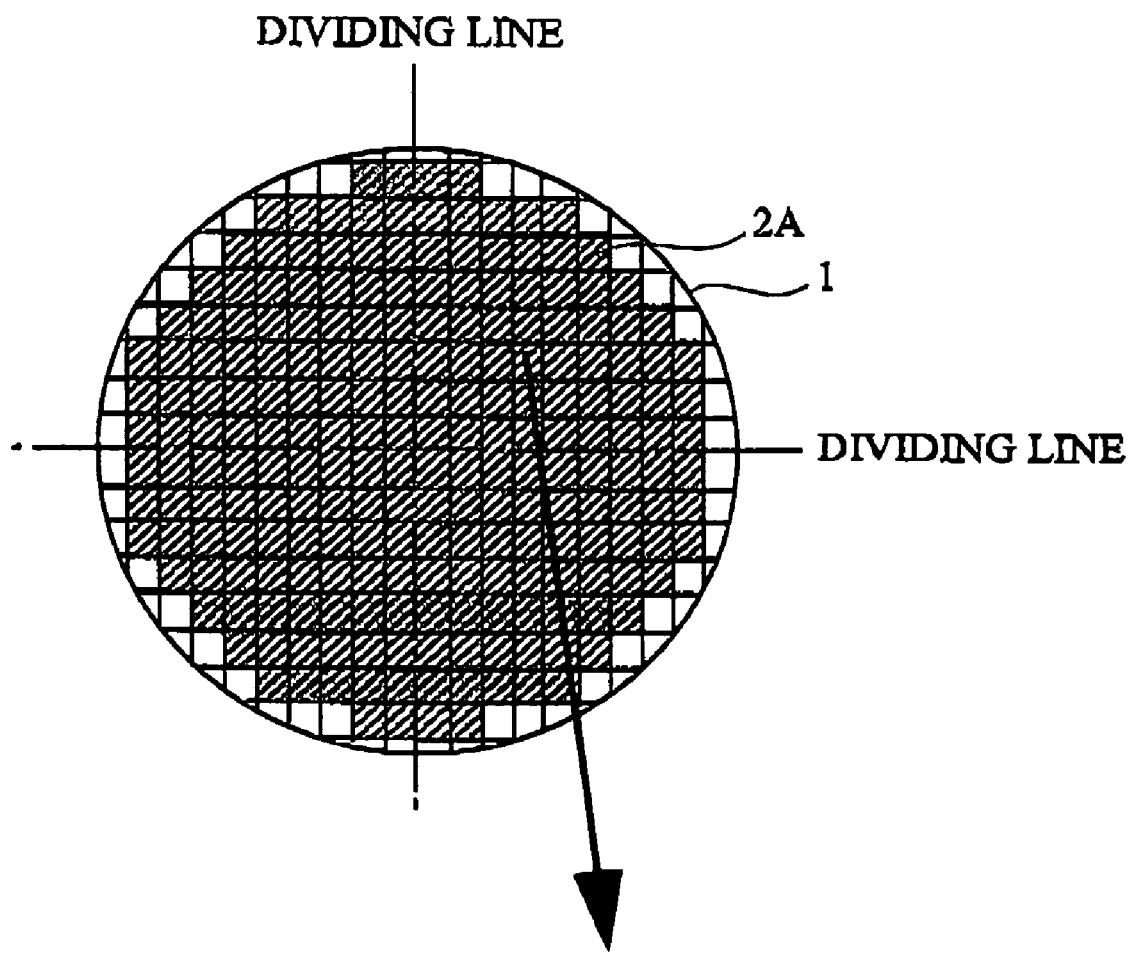
FIG. 14A is a plan view showing an example of a semiconductor chip forming region of a semiconductor wafer to be inspected.
Figure 14B:
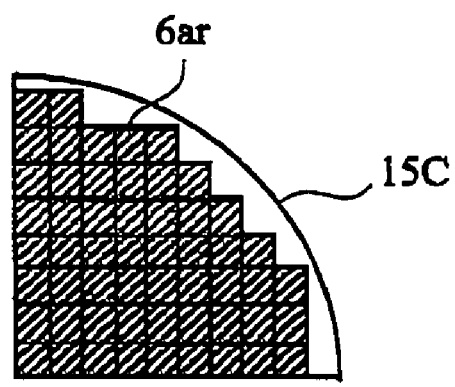
FIG. 14B is a plan view showing a semiconductor wafer obtained by dividing the semiconductor wafer to be inspected into four and a semiconductor chip forming region thereof.

FIG. 14A is a plan view showing the semiconductor element forming region (hatched region) 72 which is formed on the wafer 1 to be inspected, and FIG. 14B is a plan view showing the cut wafer 15C having the region (hatched region) 6*ar* for forming the contact terminals 6*a*, which corresponds to the wafer 1 divided into four. As described above, as a probe for inspection, a probe sheet that can be brought into contact with the semiconductor element forming region 2A of the wafer 1 at one time may be formed. However, it is also possible to perform the inspection for each quarter region of the semiconductor element forming region 2A of the wafer 1 of FIG. 14A by using the probe sheet having the region 6*ar* in which a group of the plurality of contact terminals 6*a* is formed, which is formed from the quarter size wafer 15C shown in FIG. 14B, or also possible to perform the inspection by mounting the wafer 1 which is divided into four onto the wafer support member 9.

Figure 15A:
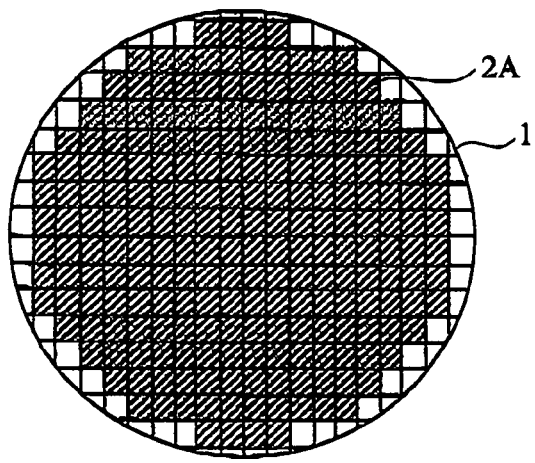
FIG. 15A is a plan view showing an example of a semiconductor chip forming region of a semiconductor wafer to be inspected.
Figure 15B:
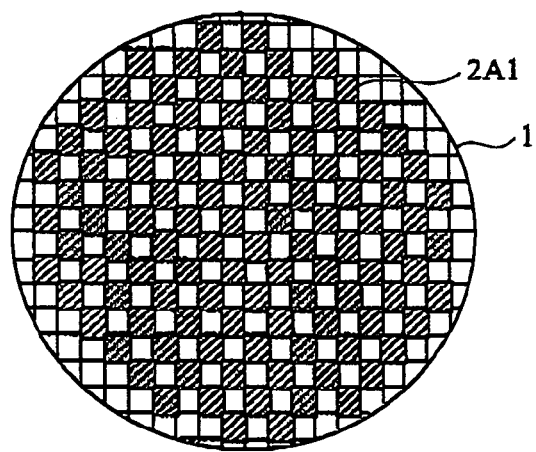
FIG. 15B is a plan view showing an example in which semiconductor chips are arranged at intervals when inspection of the semiconductor wafer to be inspected is divided and performed in a plurality of times.
Figure 15C:
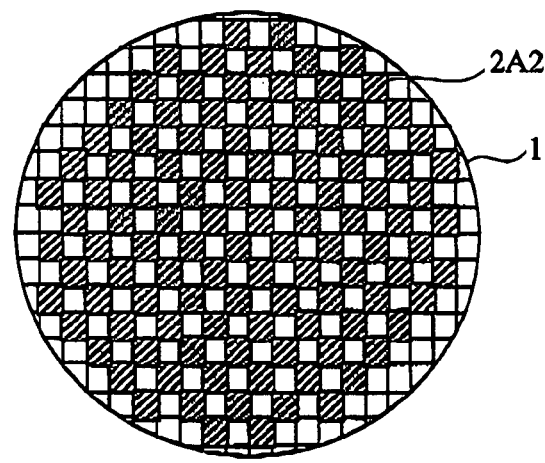
FIG. 15C is a plan view which is the companion of FIG. 15B and showing an example in which semiconductor chips are arranged at intervals when inspection of the semiconductor wafer to be inspected is divided and performed in a plurality of times.

FIG. 15A is a plan view showing the semiconductor element forming region (hatched region) 2A of the wafer 1 to be inspected. As described above, the probe sheet that can be brought into contact with the semiconductor element forming region 2A of the wafer 1 at one time may be formed as a probe sheet for inspecting the semiconductor element forming region 2A. However, for example, it is also possible to inspect the entirety of the semiconductor element forming region 2A by fabricating, in accordance with needs, one type or two or more types of the probe sheets 6 which come into contact with semiconductor element regions (hatched regions) 2A1 and 2A2 in which the plurality of chips 2 are arranged at intervals as shown in FIG. 15B and FIG. 15C, and sequentially using the sheets in inspection.

Figure 16:
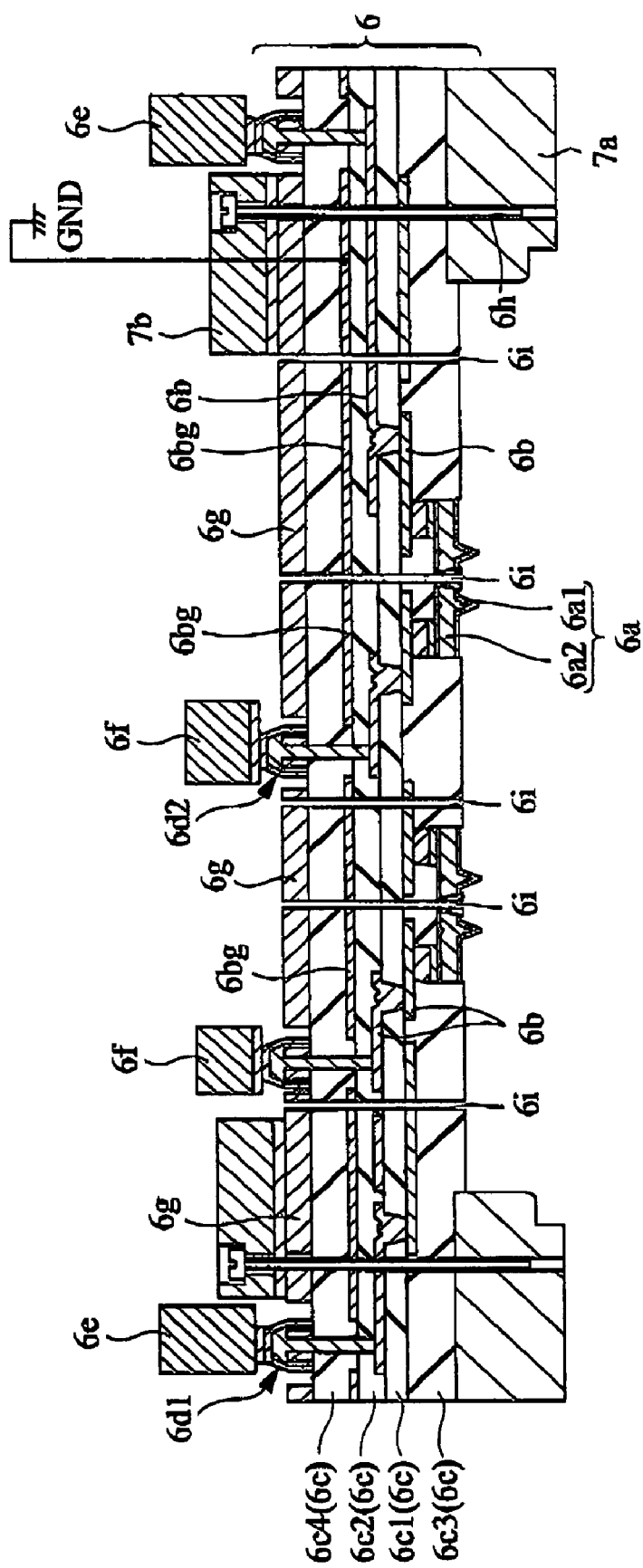
FIG. 16 is a cross-sectional view showing another example of a probe cassette of a semiconductor inspection apparatus according to another embodiment of the present invention.

In order to prevent disturbance of electrical signals as much as possible as a probe sheet for inspecting high-speed electrical signals, a structure in which a ground layer (reference potential layer) is formed on the surface (on both surfaces of the principal surface and the rear surface or one surface of the principal surface or the rear surface) of the probe sheet 6 is desirable. For example, as shown in FIG. 16, a ground layer 6*bg* for supplying a reference potential (for example, 0 V) may be provided in the wiring layers of the probe sheet 6. Consequently, even when the speed of electrical signals in the inspection becomes faster due to the improvement in the operating speed of the semiconductor devices, disturbance of the electrical signals in the inspection can be suppressed or prevented. Therefore, it is possible to respond to the improvement in performance of the semiconductor devices, and reliability of the inspection can be ensured. The ground layer 6*bg* is formed of a conductive layer of, for example, copper and is formed across a comparatively large area in the forming surface in order to suppress or prevent the disturbance of electrical signals due to noise. In this case, the ground layer 6*bg* is formed on the above-described insulating layer 6*c*2. Furthermore, above the insulating layer 6*c*2, an insulating layer 6*c*4 made of, for example, polyimide is formed so as to cover the ground layer 6*bg*. On the upper surface of the insulating layer 6*c*4, the above-described metal layer 6*g* is formed.

Figure 17:
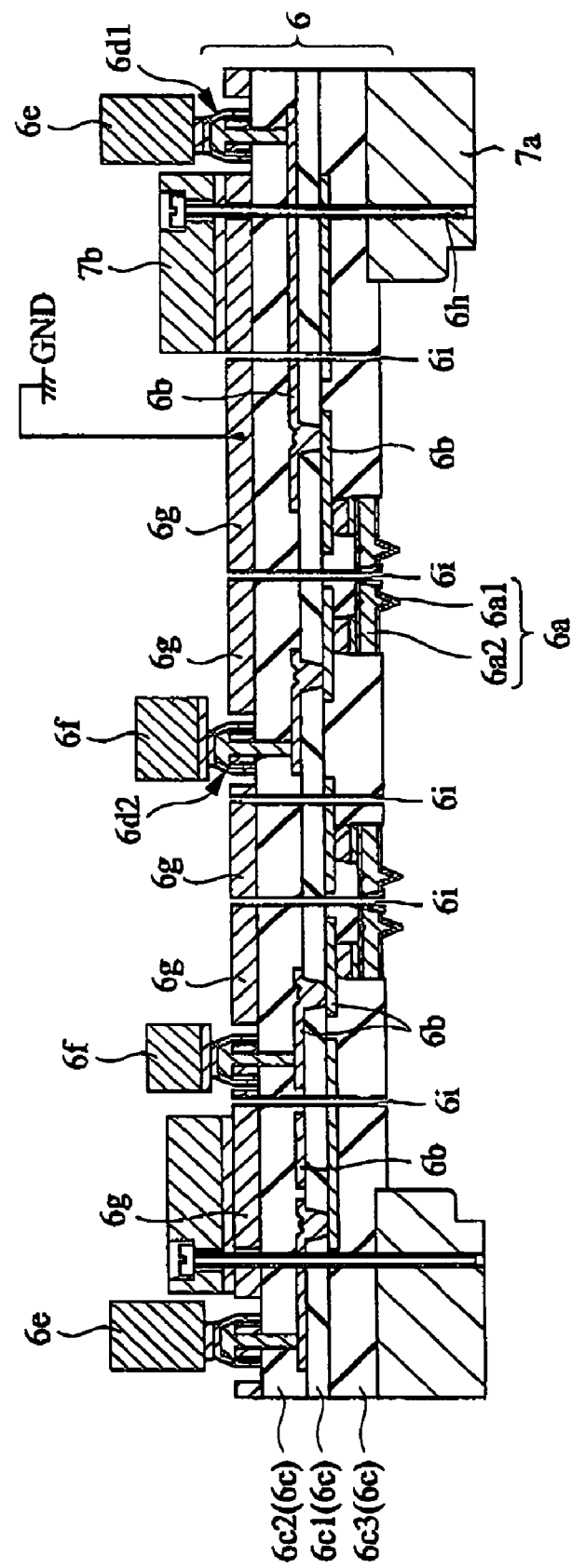
FIG. 17 is a cross-sectional view showing another example of a probe cassette of a semiconductor inspection apparatus according to another embodiment of the present invention.

Also, as shown in FIG. 17, the metal layer 6*g* can be utilized as the above-described ground layer for supplying a reference potential. When 42 alloy or invar is used as the material of the metal layer 6*g*, in accordance with needs, the surface may be plated with copper, gold, or the like. By doing so, a ground layer which is electrically more stable may be formed. In this case, since the already provided metal layer 6*g* is used, process can be simplified more than the case of FIG. 16, and the thickness of the probe sheet 6 can be kept thin.

Figure 18:
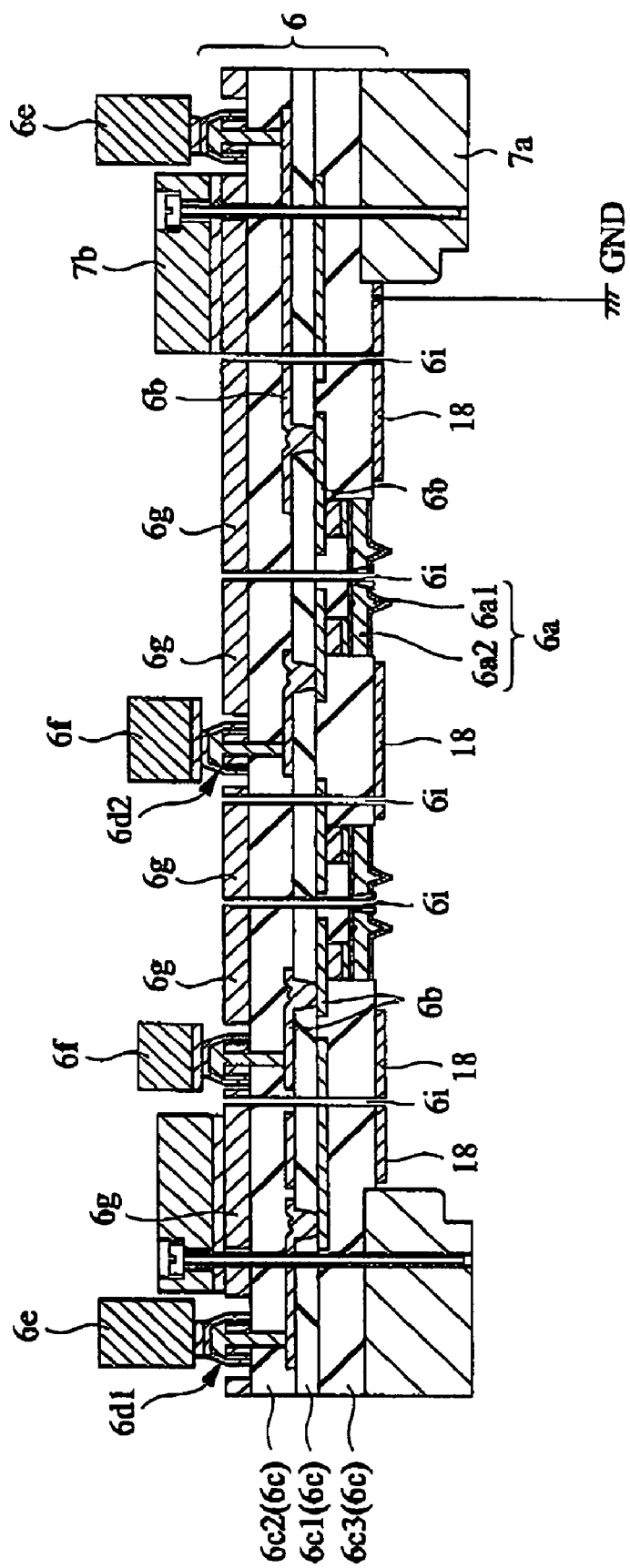
FIG. 18 is a cross-sectional view showing further another example of a probe cassette of a semiconductor inspection apparatus according to another embodiment of the present invention.

Also, as shown in FIG. 18, the ground layer for supplying a reference potential may be formed by the conductive coating film 18 on the principal surface (third principal surface) of the probe sheet 6. The pattern of the conductive coating film 18 for supplying a reference potential is formed by forming a photoresist mask and patterning the conductive coating film 18 at the time when the insulating film 17*a* of the principal surface is removed by etching and the conductive coating film 18 is exposed on the principal surface, immediately after removing the wafer 15 as a mold material by etching (see FIG. 11). Also in this case, since the conductive film 18 which is already used in the process is used, the steps can be simplified more than the case of FIG. 16, and since the insulating layer 6*c*4 is not added, the thickness of the probe sheet 6 can be made thinner than the case of the structure of FIG. 16.

Moreover, in the process of FIG. 12, the ground layer may be newly formed on the surface on which the contact terminals Ea are formed. When the ground layer is formed by a sputtering method, for example, chromium, titanium, copper, gold, nickel, and others can be used singly or in combination as a sputtering film material.

Moreover, dummy contact terminals 6*a* that do not practically contribute to inspection may be provided among the contact terminals 6*a*. This is because, when the density of arrangement of the plurality of electrodes 3 of the plurality of chips 2 of the wafer 1 is extremely uneven, the balance of the contacting part between the contact terminals 6*a* and the electrodes 3 is deteriorated, which becomes a factor of preventing the uniform displacement of the wafer plane. Therefore, when the dummy contact terminals 6*a* are appropriately provided at the positions where the electrodes 3 are not present, the dummy contact terminals 6*a* abut the principal surface of the wafer, and better parallelism between the contact terminals 6*a* for inspection and the electrodes 3 can be ensured. Thus, good contact state of both of them can be obtained. In this case, for example, the dummy contact terminals 6*a* are disposed so as to abut the dummy electrodes which are disposed in the region which is the cutting region (dicing region) at the outer periphery of the chips 2 where the electrode 3 are not densely disposed. By doing so, inspection can be carried out without damaging the chips 2 of the products.

Figure 19:
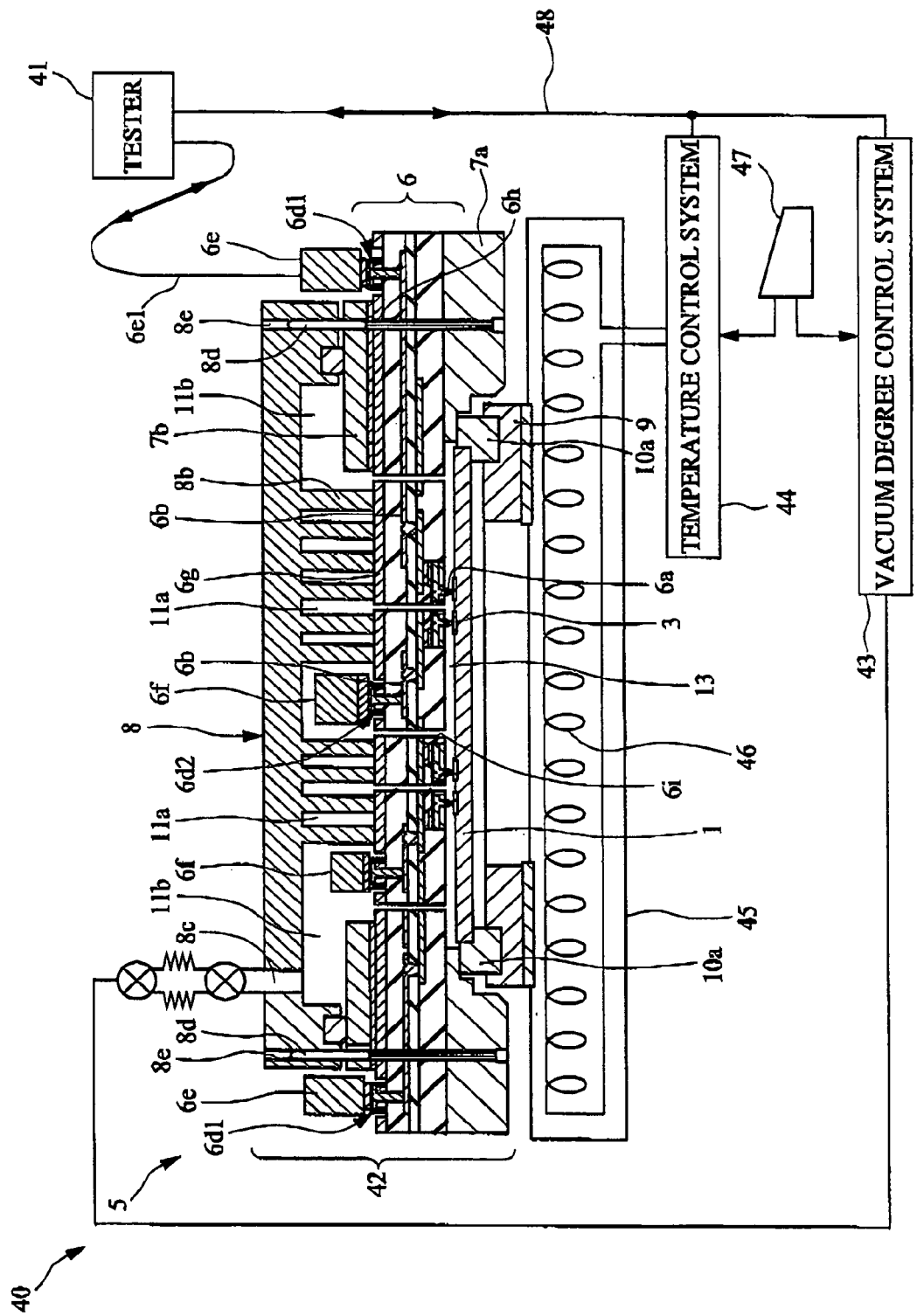
FIG. 19 is an explanatory drawing of an example of the entire configuration of an inspection system according to another embodiment of the present invention.

Next, an example of the semiconductor inspection apparatus using the probe cassette 5 of the above-described embodiment will be described with reference to FIG. 19. FIG. 19 is an explanatory drawing showing an example of the entire configuration of an inspection system 40 including the semiconductor inspection apparatus using the probe cassette 5 of FIG. 2. It should be noted that other semiconductor inspection apparatuses using the probe cassettes 5 of the above-described modified examples have similar configurations.

FIG. 19 shows a test system for carrying out electrical property inspection by applying a desired load to the principal surface of the wafer 1. In this state, the pressure is reduced by vacuuming from the exhaust outlet 8*c* to apply a desired air pressure to the group of the plurality of contact terminals 6*a* on the principal surface of the probe sheet 6, and then, electrical signals for inspection are transmitted between the group of the contact terminals 6*a* which is in contact with the group of the electrodes 3 of the chips 2 of the wafer 1 and a tester 41 which performs inspection of the electrical properties of the semiconductor devices formed on each of the plurality of chips 2 of the wafer 1 through the lead wirings 6*b*, the lead electrodes 6*d*1 and 6*d*2, the connectors 6*e*, and the cables 6*e*1.

In the entire configuration of the inspection system 40 of this embodiment, the probe cassette 5 is configured as a full wafer prober. The inspection system 40 includes a sample support system 42 which supports the wafer 1 as the target to be inspected and is connected to a vacuuming device (not shown), the probe sheet 6 which is brought into contact with each of the plurality of the electrodes 3 of the plurality of chips 2 of the wafer 1 and performs transmission and reception of electrical signals, a vacuum degree control system 43 which controls the load (atmospheric pressure) applied to the probe sheet 6 of the sample support system 42, a temperature control system 44 which controls the temperature of the wafer 1, and the tester 41 which performs inspection of the electrical properties of the wafer 1. The plurality of chips (semiconductor elements) 2 are arranged on the wafer 1, and the plurality of electrodes 3 as external connection electrodes are arranged on the principal surface of each chip 2.

The probe sheet 6 is electrically connected to the tester 41 via the contact terminals 6*a*, the lead wirings 6*b*, the lead electrodes 6*d*1 and 6*d*2, the connectors 6*e*, and the cables 6*e*1.

A heater 46 is installed in a sample support 45 below the wafer support member 9. The heater 46 is the means for heating the wafer 1 in desired inspection. For example, the temperature during the inspection is normally about 20° C. to 90° C. and about 125° C. to 150° C. in the burn-in inspection. The temperature of the heater 46 is adjusted by the above-mentioned temperature control system 44. More specifically, the temperature control system 44 controls the temperature of the water 1 mounted on the sample support 45 by controlling the heater 46 of the sample support 45 or a cooling jig. In addition, the temperature control system 44 is equipped with an operation unit 47 and can receive various instructions relating to temperature control, for example, can receive instructions of manual operations.

An example of a case where the heater 46 is disposed only below the rear surface of the wafer 1 and no heater is provided above the principal surface of the wafer 1, i.e., the probe sheet 6 side is described here. However, in such a case, difference in temperature occurs between the wafer 1 and the probe sheet 6, and position misalignment may occur between the electrodes 3 of the wafer 1 and the contact terminals 6*a* of the probe sheet 6 due to the temperature difference. Therefore, in this embodiment, in order to prevent position misalignment due to the temperature difference between the wafer 1 which is heated to a desired temperature by the heater 46 and the probe sheet 6 on which the contact terminals 6*a* for carrying out electrical signal inspection by contacting the electrodes 3 of the plurality of chips 2 of the wafer 1 are formed, and to carry out positioning accurately in a short period of time, a heating element capable of controlling temperature may be provided in the probe sheet 6 or on the upper surface (for example, upper part of the vacuuming support member 8) of the probe cassette 5 in advance. In order to form the heating element, for example, a metal material having a high resistance value such as nickel chrome or a high-resistance conductive resin may be directly formed in the probe sheet 6, or a sheet made of such a material may be attached to the probe sheet 6. Alternatively, a heated liquid (or a fluid such as a gas) is caused to flow in a tube in a heat block as a heating element, and the heat block may be brought into contact with the probe sheet 6. Alternatively, the atmosphere of a desired temperature can be realized by putting the entire probe cassette 5 in a constant-temperature chamber. The temperature of the heating element is controlled by the above-described temperature control system 44. The temperature control system 44 controls the temperature of the heating element which is disposed above the principal surface of the wafer 1 in conjunction with the temperature of the heater 46 which is disposed below the rear surface of the wafer 1.

When the heating element is provided also above the principal surface of the wafer 1 in this manner, the temperature difference between the wafer 1 and the probe sheet 6 can be reduced. Therefore, the positioning accuracy of the electrodes 3 and the contact terminals 6a can be improved. Particularly, different from conventional methods in which the temperature of the probe cassette is determined by heat radiation from the heated wafer 1 and contact upon probing, in the method in which the probe sheet 6 is independently kept at a temperature of inspection in the above-described manner, the occurrence of temperature difference between the wafer 1 and the probe sheet 6 during inspection can be prevented. In addition, probing with high positional accuracy can be performed by using the probe sheet 6 which is backed by the metal layer 6g having a linear expansion coefficient approximately equal to that of silicon.

The above-mentioned vacuum degree control system 43 controls the vacuum degree of the air in the space 13 in accordance with the progress information of the test operation of the tester 41 which is transmitted via a cable 48 and the temperature information from the temperature control system 44. Moreover, the vacuum degree control system 43 can receive input of various instructions relating to vacuum degree control from the operation unit 47, for example, can receive instructions of manual operations.

Next, an example of the operations of the semiconductor inspection apparatus of this embodiment will be described. First, prepared is a probe head in which the sheet lower-part support member 7a is integrated with the vacuuming support member 8 which is positioned by inserting the positioning pins 8d fixed to the sheet lower-part support member 7a adhered to the probe sheet 6 into the positioning holes 8e and the holes 6h.

Subsequently, after the wafer 1 as the target to be inspected is placed on the wafer support member 9, the positioning is carried out so that the group of the plurality of the electrodes 3 formed on the plurality of chips (semiconductor elements) 2 on the wafer 1 is disposed right below the numerous contact terminals 6a which are juxtaposed on the principal surface of the probe sheet 6 of the probe head, and the vacuumed and fixed probe cassette (sample support system 42) is prepared. Then, the wafer 1 is heated at a desired temperature by the temperature control system in the above-described manner.

After these preparatory steps, the probe cassette 5 is placed on the sample support 45, and then, the vacuum degree is appropriately adjusted by operating the vacuum degree control system 43 and vacuuming from the exhaust outlet 8c. By doing so, a pressurizing force is applied by a desired air pressure to the group of the contact terminals 6a formed on the probe sheet 6. In this case, the air in the space 13 between the facing surfaces of the principal surface of the wafer 1 and the probe sheet 6 is exhausted (in other words, the air pressure of the space 13 is reduced). By doing so, the wafer 1 is mainly sucked and deformed, and a uniform load by virtue of the pressure reduction is applied to the rear surface of the wafer 1, thereby pressing the plurality of electrodes 3 of the plurality of chips 2 of the wafer 1 against the plurality of contact terminals 6a of the probe sheet 6 at one time. More specifically, when the tips of the plurality of contact terminals 6a having high relative positional accuracy with respect to the electrodes 3 are pressed against the surface of the group (entirety) of the plurality of electrodes 3 of the plurality of chips 2 of the wafer 1 so as to follow the surface, the terminals can be brought into contact with the electrodes 3, which are arranged on the wafer 1, with a uniform load (about 1 to 150 mN per one pin), and the contact terminals 6a and the electrodes 3 are mutually connected with a low resistance (0.01 Ω to 0.1 Ω).

As described above, in this embodiment, contact can be achieved while controlling the load applied to each contact terminal 6a by vacuuming the air in the space 13 between the principal surface of the wafer 1 and the principal surface (third principal surface) of the probe sheet 6 from the exhaust outlet 8c so as to reduce (adjust) the air pressure of the space 13.

For example, when 30 contact terminals 6a are brought into contact with an 8 mm square chip 2, an arbitrary contact load can be selected within the range of 0 to 215 mN for one contact terminal 6a by controlling the pressure reduction amount (0 to 1 atmospheric pressure: $1.013 \times 10^4$ mN/cm$^2$). Similarly, for example, when 250 contact terminals 6a are brought into contact with an 8 mm square chip 2, an arbitrary contact load can be selected within the range of 0 to 25.9 mN for one contact terminal 6a by controlling the pressure reduction amount (0 to 1 atmospheric pressure).

When the contact terminals 6a having a sharp quadrangular pyramidal or truncated pyramidal shape are used, stable contact resistance values can be realized with a low load (for example, about several mN or more) since the contact area is extremely small. Therefore, it is sufficient if the control of the contact pressure within the above-described load control range can be realized.

As described above, in a state where the plurality of contact terminals 6a of the probe sheet 6 and the plurality of electrodes 3 of the plurality of chips 2 of the wafer 1 are in contact with each other, operating currents, operation inspection signals, and others are transmitted between the wafer 1 and the tester 41 via the cables 6e1, the connectors 6e, the lead electrodes 6d1 and 6d2, the lead wirings 6b, and the contact terminals 6a, thereby determining, for example, the operating properties of the semiconductor devices.

Next, the typical examples of the manufacturing method of the semiconductor devices including inspection process or inspection methods using the above-described semiconductor inspection apparatus will be described with reference to FIG. 20. It should be noted that, in FIG. 20, inspection processes using the above-described semiconductor inspection apparatus are marked by dotted hatching.

(1) A manufacturing method of semiconductor devices of this embodiment includes: a step of fabricating integrated circuits on the chips 2 of the wafer 1 to form semiconductor devices (formation of semiconductor circuits, front-end, step 100); a step of inspecting the electrical properties of the plurality of chips (semiconductor devices) 2 in a wafer level (state of a wafer) at one time by the semiconductor inspection apparatus of this embodiment (wafer inspection, step 101A); a step of cutting the wafer into individual chips 2 and separating it into individual chips (semiconductor elements or semiconductor devices) 2 (dicing, step 102A); and a step of sealing the chips (semiconductor elements) 2 with a resin or the like (assembly/sealing, step 103). Thereafter, the chips undergo burn-in (step 104A), sorting inspection (step 105A), and appearance inspection (step 106A), and then are shipped as chip package products. Note that the front-end is also called as a wafer process, in which integrated circuit elements are formed through a step of forming an insulating film, an impurity doping step, an etching step, and others on the principal surface of a wafer which is cut from a semiconductor ingot, and then, wiring layers and electrodes are formed on the upper surfaces thereof. After the wafer, process, wafer inspection can be performed.

(2) In another manufacturing method of semiconductor devices of this embodiment, after sequentially performing the formation of semiconductor circuits (step 100), the wafer inspection (step 101A), and the dicing (step 102A), attachment of a socket for chip inspection (step 200), burn-in (step 104B), sorting inspection (step 105B), detachment from the socket (step 201), and appearance inspection (step 106B) are performed, and then, the products are shipped as bare chip shipping products.

(3) In another manufacturing method of semiconductor devices of this embodiment, after sequentially performing the formation of semiconductor circuits (step 100) and the wafer inspection (step 101A), burn-in (step 104C), sorting inspection (step 105C), and appearance inspection (step 106C) are performed without cutting the wafer 1, and then, the products are shipped as full-wafer products. Also in the burn-in (step 104C) and sorting inspection (step 105C), inspection using the semiconductor inspection apparatus of this embodiment is performed.

(4) In another manufacturing method of semiconductor devices of this embodiment, after sequentially performing the formation of semiconductor circuits (step 100) and the wafer inspection (step 101A), burn-in (step 104C) and sorting inspection (step 105C) are performed, and then, through the dicing (step 102B) and appearance inspection (step 106D), the products are shipped as bare chip shipping products. Also in the burn-in (step 104C) and sorting inspection (step 105C), inspection using the semiconductor inspection apparatus of this embodiment is performed.

(5) In another manufacturing method of semiconductor devices of this embodiment, after the formation of semiconductor circuits (step 100) is performed, the wafer 1 is divided into wafers having a plurality of chips 2 and a desired size (for example, quarter) (step 300A). Then, the electrical properties of the plurality of chips 2 of the divided wafers are inspected at one time in the divided wafer level by the semiconductor inspection apparatus of this embodiment (step 101B). Then, through burn-in (step 104D), sorting inspection (step 105D), and appearance inspection (step 106E), the products are shipped as divided wafer shipping products. Also in the burn-in (step 104D) and sorting inspection (step 105D), inspection using the semiconductor inspection apparatus of this embodiment is performed.

(6) In another manufacturing method of semiconductor devices of this embodiment, after sequentially performing the formation of semiconductor circuits (step 100), division of the wafer 1 (step 300A), inspection of the divided wafers (step 101B), burn-in (step 104D), and sorting inspection (step 105D), the divided wafers are cut into individual chips 2 and separated into the individual chips 2 (dicing, step 102C), and appearance inspection (step 106F) is performed. Then, the products are shipped as bare chip shipping products. Also in the burn-in (step 104D) and sorting inspection (step 105D), inspection using the semiconductor inspection apparatus of this embodiment is performed.

(7) In another manufacturing method of semiconductor devices of this embodiment, after the formation of semiconductor circuits (step 100), a resin layer or the like is formed on the principal surface of the wafer 1 (resin layer formation step 400). By doing so, the plurality of chips 2 of the wafer 1 can be sealed at one time. Then, the electrical properties of the plurality of chips 2 formed on the wafer 1, on which the resin layer or the like is formed, are inspected at one time by the semiconductor inspection apparatus of this embodiment (wafer inspection step 101C). Then, after burn-in (step 104E), sorting inspection (step 105E), dicing (step 102D), and appearance inspection (step 106G) are sequentially performed, the products are shipped as CSP shipping products. Also in the burn-in (step 104E) and sorting inspection (step 105E), inspection using the semiconductor inspection apparatus of this embodiment is performed.

(8) In another manufacturing method of semiconductor devices of this embodiment, after sequentially performing the formation of semiconductor circuits (step 100), the resin layer formation (step 400), the wafer inspection (step 101C), burn-in (step 104E), and sorting inspection (step 105E), appearance inspection (step 106H) is performed. Then, the products are shipped as full-wafer CSP shipping products. Also in the burn-in (step 104E) and sorting inspection (step 105E), inspection using the semiconductor inspection apparatus of this embodiment is performed.

(9) In another manufacturing method of semiconductor devices of this embodiment, after sequentially performing the formation of semiconductor circuits (step 100) and the resin layer formation (step 400), the wafer 1 is divided into wafers having a plurality of chips 2 and a desired size (for example, quarter) (step 300B). Then, the electrical properties of the plurality of chips 2 of the divided wafers are inspected at one time in the divided wafer level by the semiconductor inspection apparatus of this embodiment (step 101D). Thereafter, through burn-in (step 104F), sorting inspection (step 105F), and appearance inspection (step 106I), the products are shipped as divided wafer CSP shipping products. Also in the burn-in (step 104F) and sorting inspection (step 105F), inspection using the semiconductor inspection apparatus of this embodiment is performed.

(10) In another manufacturing method of semiconductor devices of this embodiment, after sequentially performing the formation of semiconductor circuits (step 100), the resin layer formation (step 400), the division of the wafer (step 300B), inspection of the divided wafers (step 101D), burn-in (step 104F), and sorting inspection (step 105F), the divided wafers are divided into individual chips 2 (dicing, step 102E). Then, after appearance inspection (step 106J) is performed, the products are shipped as CSP shipping products. Also in the burn-in (step 104F) and sorting inspection (step 105F), inspection using the semiconductor inspection apparatus of this embodiment is performed.

Figure 21A:
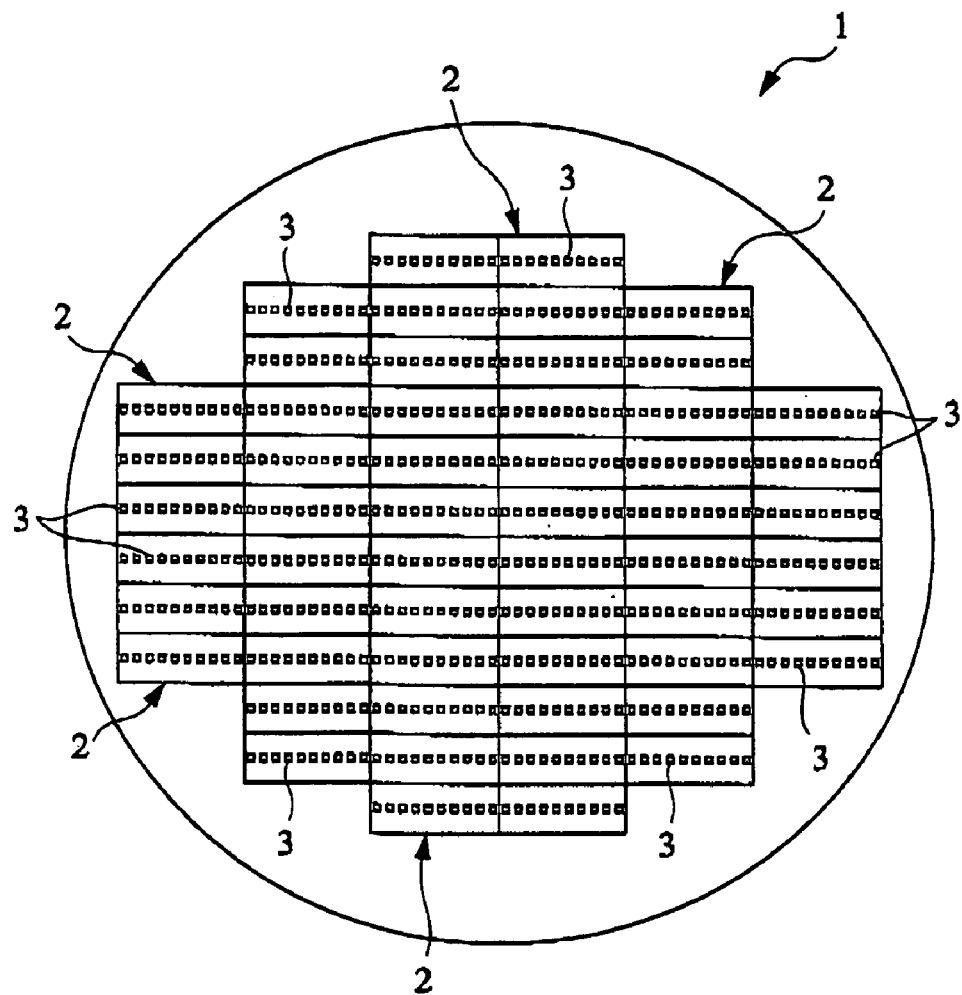
FIG. 21A is a plan view of an entire semiconductor wafer in a manufacturing process of semiconductor devices according to another embodiment of the present invention.

(11) Next, a specific example of the manufacturing methods of semiconductor devices of above-described (7) to (10) will be described with reference to FIG. 21A to FIG. 23B. FIG. 21A, FIGS. 22A and 23A are plan views of the entire wafer 1 during manufacturing process of semiconductor devices, and FIG. 21B, FIG. 22B and FIG. 23B are cross-sectional views showing a main part of the wafer 1 of FIG. 21A, FIG. 22A, and FIG. 23A, respectively.

Figure 21B:
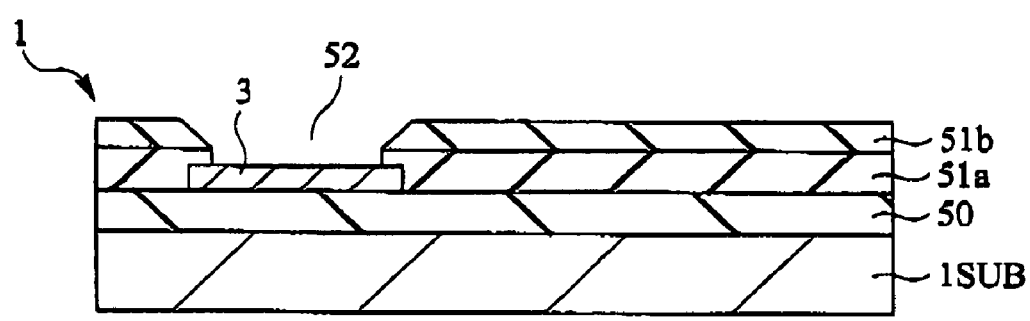
FIG. 21B is a cross-sectional view of a main part of the semiconductor wafer of FIG. 21A.
Figure 22A:
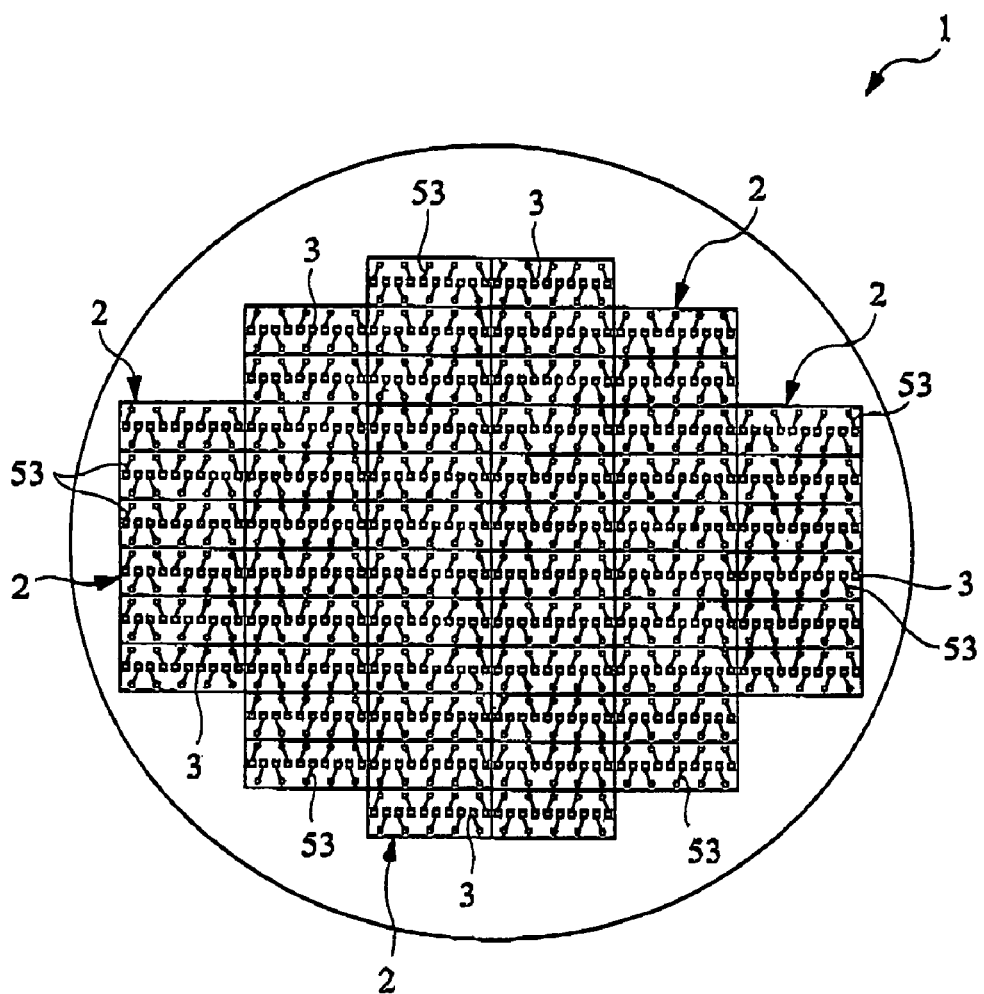
FIG. 22A is a plan view of the entire semiconductor wafer in a manufacturing process of semiconductor devices subsequent to FIG. 21A.

FIG. 21A is a plan view of the entire principal surface of the wafer 1 after the above-described formation of semiconductor circuits (step 100), FIG. 21B shows a cross-sectional view of a main part thereof. On the principal surface of the wafer 1, for example, a plurality of rectangular chips 2 are disposed. In this case, the case where a plurality of electrodes 3 are disposed at the center positions in the shorter side direction along the longitudinal direction of the principal surface of each chip 2 is shown as an example. On the principal surface or above the principal surface of a semiconductor substrate 1SUB, which constitutes the wafer 1, for example, desired integrated circuit elements such as MIS FETs (Metal Insulator Semiconductor Field Effect Transistors), bipolar transistors, resistances, or capacitors are formed. BY connecting the integrated circuit elements by wiring formed in an insulating layer 50, integrated circuits such as memory circuits or logic circuits are formed. The above-mentioned electrodes 3 are formed on the insulating layer 50 at this point. The electrodes 3 are made of, for example, aluminum or aluminum alloy and are lead electrodes of the integrated circuits. As the uppermost layers above the uppermost insulating film 50, surface protective films 51a and 51b are sequentially deposited from below. The surface protective film 51a is made of an inorganic insulating material such as a single film of a silicon oxide film or stacked films of a silicon oxide film and a silicon nitride film, and the surface protective film 51b formed thereon is made of an organic insulating material such as a polyimide resin. Openings 52 are formed in a part of the surface protective films 51a and 51b, through which a part of the electrodes 3 is exposed. Note that this stage is common in the above-described manufacturing methods of semiconductor devices of (1) to (6). In the above-described manufacturing methods of semiconductor devices of (1) to (6), the tip part of the contact terminals 6a of the probe sheet 6 of the semiconductor inspection apparatus are brought into contact with the electrodes 3 and the inspection of electrical properties are performed in following inspection process.

Figure 22B:
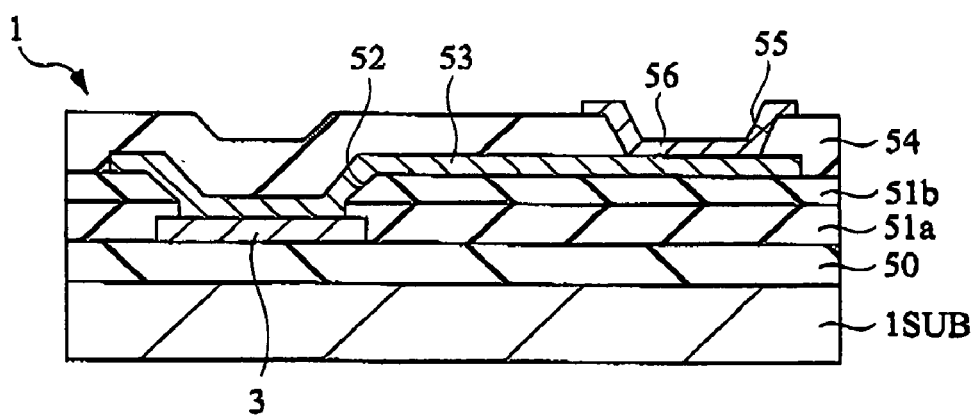
FIG. 22B is a cross-sectional view of a main part of the semiconductor wafer of FIG. 22A.
Figure 23A:
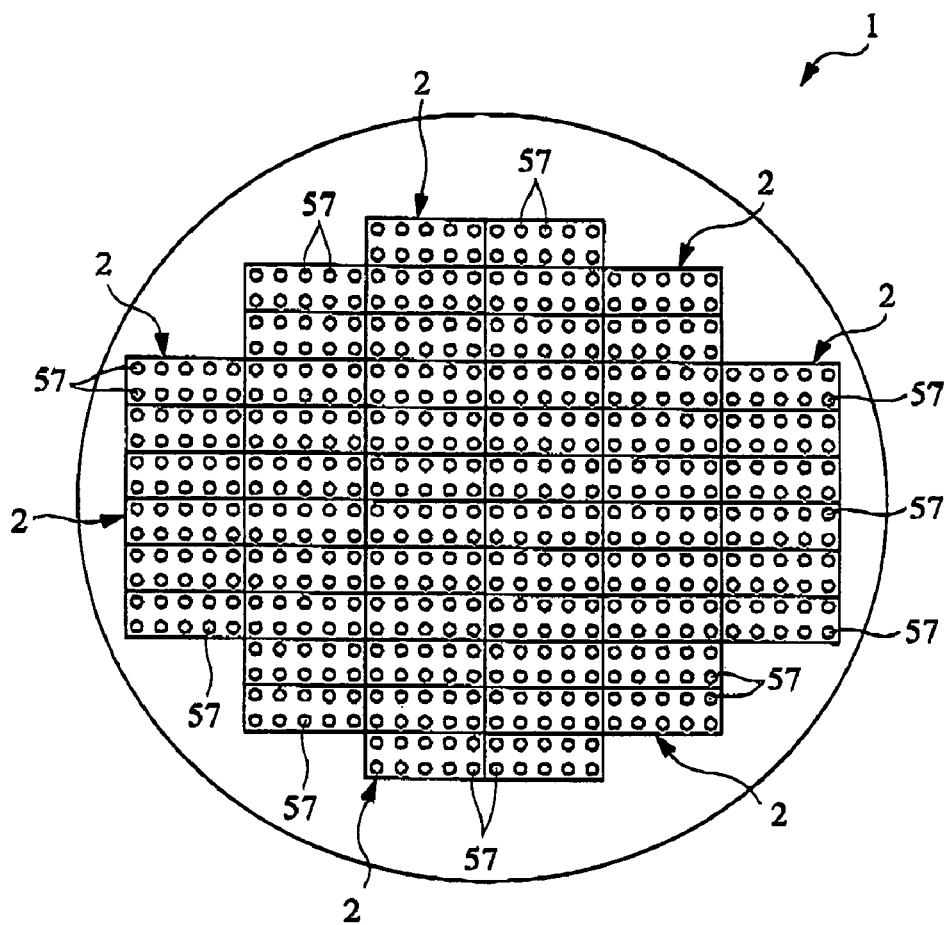
FIG. 23A is a plan view of the entire semiconductor wafer in a manufacturing process of semiconductor devices subsequent to FIG. 22A.
Figure 23B:
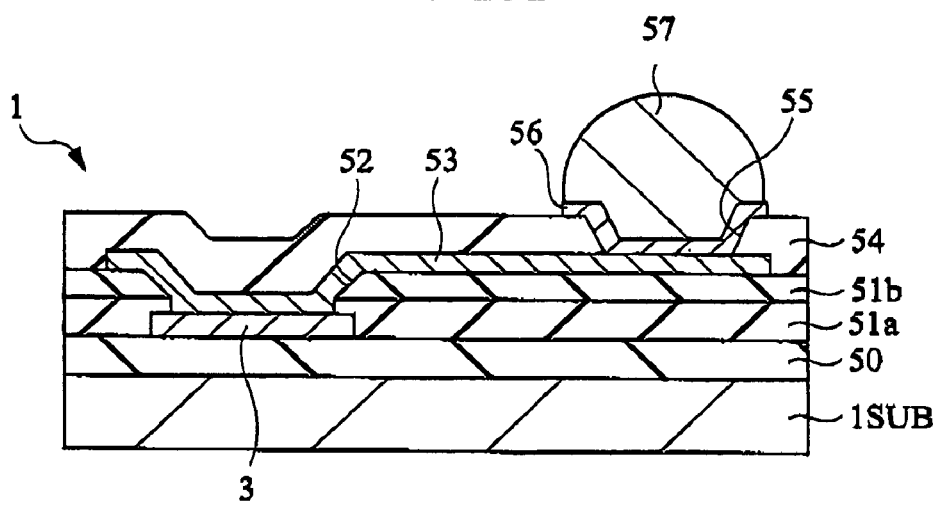
FIG. 23B is a cross-sectional view of a main part of the semiconductor wafer of FIG. 23A.

Subsequently, as shown in FIG. 22A and FIG. 22B, after rewirings 53 are formed on the principal surface of the wafer 1, a resin layer (above-described resin layer) 54 such as a polyimide resin is further deposited so as to seal the plurality of chips 2 on the principal surface of the wafer 1 at one time while maintaining the state of the wafer 1. The rewiring 53 is made of, for example, copper and has a function to achieve the matching in dimensions between the electrodes 3 of the integrated circuits and the electrodes of packaging wiring board for packaging the chips 2 by leading out the electrodes 3 from the dense region of the electrodes 3 to an open region. Then, after openings 55 through which a part of the rewirings 53 are exposed are formed in some parts of the resin layer 54, an undercoat metal patterns 56 which are connected to the rewirings 53 exposed through the openings 55 are formed.

Subsequently, the process may proceed to the step of wafer inspection (step 101C) or wafer division (step 300B) of FIG. 20 described above. In these cases, in the wafer inspection steps (step 101C, 101D), burn-in (step 104E, 104F), and sorting inspection (step 105E, 105F), each of the inspections is performed in a state where the contact terminals 6a of the probe sheet 6 of the semiconductor inspection apparatus are in contact with the above-described undercoat metal patterns 56.

Figure 20:
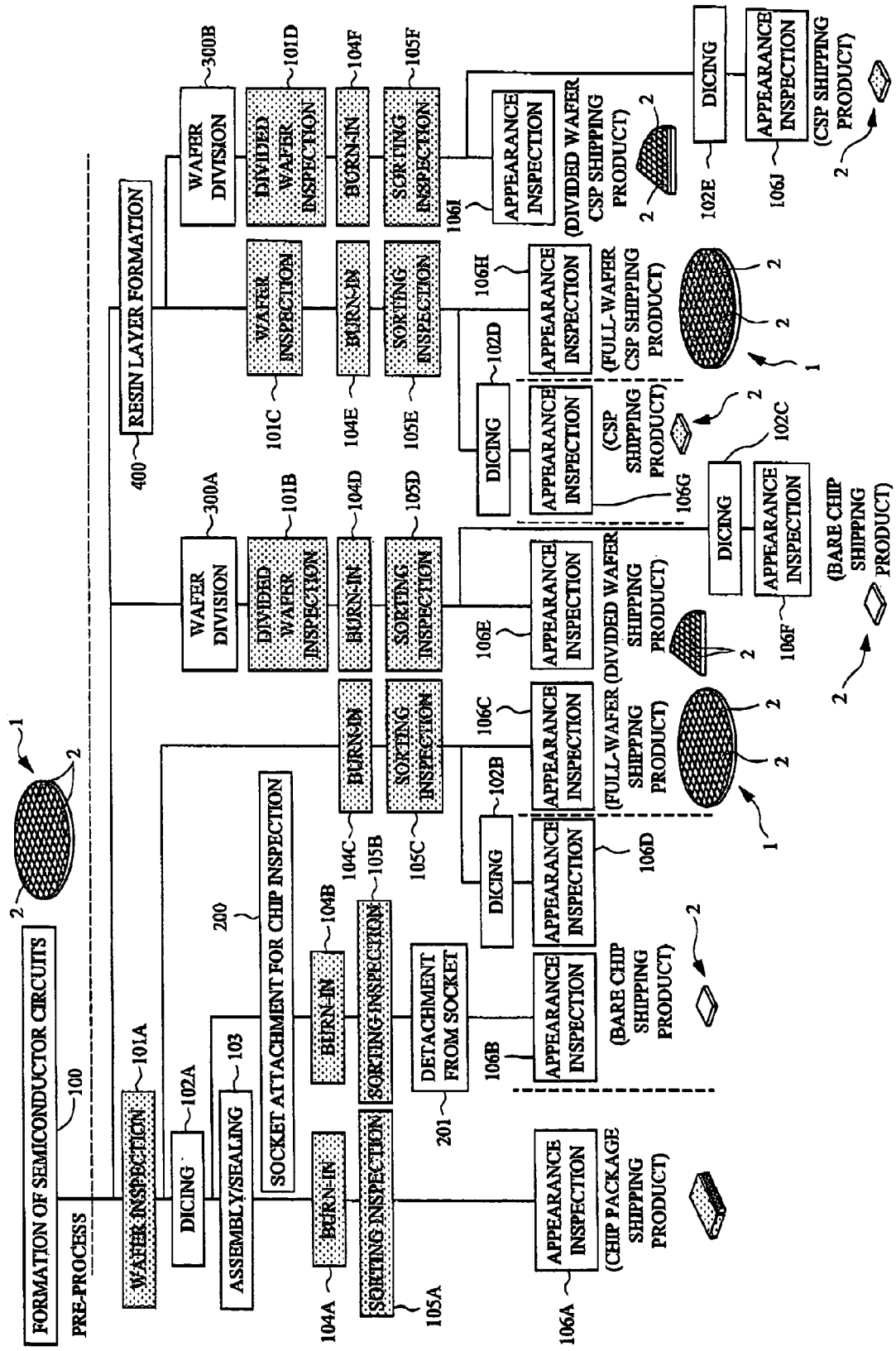
FIG. 20 is a flowchart showing typical examples of manufacturing process including the inspection steps of semiconductor devices according to another embodiment of the present invention.

On the other hand, without proceeding to the steps of wafer inspection (step 101C) or wafer division (step 300B) of FIG. 20 described above, the process may proceed to the following step. That is, as shown in FIG. 23, bumps 57 made of solder or gold (Au) are formed at one time on the plurality of respective undercoat metal patterns 56 of the plurality of chips 2 of the principal surface of the wafer 1. Then, the process may proceed to the step of wafer inspection (step 101C) or wafer division (step 300B) of FIG. 20 described above. In these cases, in the wafer inspection step (step 101C, 101D), burn-in (step 104E, 104F), and sorting inspection (step 105E, 105F), each of the inspections is performed in a state where the contact terminals 6a of the probe sheet 6 of the semiconductor inspection apparatus are in contact with the bumps 57.

In the steps of inspecting the electrical properties of the chips 2 in the manufacturing methods of semiconductor devices described in above (1) to (11), good contact properties can be achieved with high positional accuracy by using the probe cassette of this embodiment.

More specifically, since the inspection is performed by use of the pyramidal or truncated pyramidal contact terminals 6a which are formed by performing plating with using the holes formed by anisotropic etching of a substrate with crystallinity as mold materials, stable contact properties can be realized with a low contact pressure, and inspection can be carried out without damaging the semiconductor elements below. In addition, since the plurality of contact terminals 6a are backed by the metal layer 6g having the same linear expansion coefficient as the wafer 1 (or the group of the plurality of contact terminals 6a is surrounded by the metal layer 6g), unnecessary stress is not applied to the contact terminals 6a even during inspection operation, and contact with accurate relative positions of the wafer 1 and the electrodes 3 can be realized.

Furthermore, the probing marks formed on the electrodes 3 of the semiconductor elements are small and formed in dots (dots concaved in a pyramidal or truncated pyramidal shape). Therefore, a flat region with almost no probing marks is left on the electrode surface, and stable contact resistance values can be ensured even when inspection by means of the contact is performed a plurality of times like that shown in FIG. 20.

Particularly, even when inspection steps such as initial property inspection, burn-in, and sorting inspection are performed a plurality times, since the probe sheet 6 attached with the parts for inspection has the structure in which the protruding contact terminals 6a are in close contact with the electrodes of semiconductor elements for inspection under vacuum, damages (roughness of electrode surface) on the pads (electrodes 3) such as the probing marks formed on the electrodes 3 of the wafer 1 in the series of inspection steps of the semiconductor elements are small even after all inspection steps are completed, and reliability of the following connecting steps of the semiconductor elements (e.g., wire bonding, solder bump formation, Au bump formation, and Au—Sn bonding) can be improved.

Moreover, since the rectangular pyramidal or rectangular truncated pyramidal contact terminals 6a formed on the thin film probe sheet 6 are brought into contact with the electrodes 3 of the wafer 1 corresponding to the contact terminals by reducing the air pressure in the space 13 formed between the facing surfaces of the principal surface of the probe sheet 6 and the principal surface of the wafer 1, the contact terminals 6a can be brought into contact with the electrodes 3 with a uniform pressure by a simple pressing mechanism utilizing the atmospheric pressure. Therefore, stable contact resistance 6 values can be realized even when the area is large. That is, it is possible to respond to the increase in the area of the wafer 1.

Moreover, since necessary electronic components (for example, resistors, capacitors, fuses, and connectors) 6f can be readily disposed and mounted on the rear surface of the probe sheet 6 which is close to the contact terminals 6a of the principal surface of the probe sheet 6 by using the thin-film wiring circuit formation technologies, stable inspection and circuit operations can be realized.

In the foregoing, the invention made by the inventor of the present invention has been concretely described based on the embodiments. However, it is needless to say that the present invention is not limited to the foregoing embodiments and various modifications and alterations can be made within the scope of the present invention.

The effect obtained by the representative one of the inventions disclosed in this application will be briefly described as follows.

(1) The positional accuracy of the tips of the contact terminals can be ensured, and thus, it is possible to reliably inspect the semiconductor elements having numerous electrodes for inspection or electrodes distributed over a large area with narrow pitches.

(2) The contact terminals can be brought into contact with the numerous electrodes for inspection or the electrodes which are distributed over a large area with narrow pitches with a constant contact load, and thus, it is possible to reliably inspect the semiconductor elements.

(3) A structure in which electronic components for an inspection circuit can be mounted in the vicinity of the contact terminals is provided, and thus, it is possible to ensure good connection to the electrodes and improve the electrical properties and reliability.

(4) The assembly performance of the probe sheet on which the contact terminals are formed is improved, procedures and operations of inspection steps are simplified, and the cost of inspections steps of semiconductor devices is suppressed by suppressing the assembly cost of the inspection apparatus, and thus, it is possible to reduce the overall manufacturing cost of semiconductor devices.

What is claimed is:

1. A semiconductor inspection apparatus comprising:
    (a) a support member supporting a semiconductor wafer having a first principal surface and a second principal surface which is on the other side of the first principal surface, a plurality of semiconductor chips formed on said first principal surface, and a plurality of electrodes disposed on each of said plurality of semiconductor chips;
    (b) a probe sheet having a third principal surface facing said first principal surface of said semiconductor wafer with a desired space provided therebetween, a fourth principal surface which is on the other side of said third principal surface, a plurality of contact terminals disposed on said third principal surface, a plurality of wirings respectively led from said plurality of contact terminals, and a plurality of lead electrodes led to said fourth principal surface via said plurality of wirings;
    (c) a tester connected to said plurality of lead electrodes of said probe sheet and electrically inspecting said plurality of semiconductor chips of said semiconductor wafer at one time; and
    (d) pressure reducing means for reducing the pressure of said desired space in said inspection so that said semiconductor wafer is mainly deformed to bring the plurality of electrodes of the plurality of semiconductor chips of said semiconductor wafer into contact with said plurality of contact terminals of said probe sheet.

2. The semiconductor inspection apparatus according to claim 1,
    wherein parts of said plurality of contact terminals which come into contact with the respective electrodes of the plurality of semiconductor chips of said semiconductor wafer are formed to have a pyramidal or truncated pyramidal shape.

3. The semiconductor inspection apparatus according to claim 1,
    wherein a support member for supporting said probe sheet in said inspection is provided on said fourth principal surface side of said probe sheet.

4. The semiconductor inspection apparatus according to claim 1,
    wherein said probe sheet can be replaced in accordance with a type of said inspection.

5. A manufacturing method of a semiconductor device comprising:
    (a) a step of preparing a semiconductor wafer having a first principal surface and a second principal surface which is on the other side of the first principal surface;
    (b) a step of forming a plurality of semiconductor chips on the first principal surface of said semiconductor wafer; and
    (c) a step of electrically inspecting said plurality of semiconductor chips of said semiconductor wafer by using a semiconductor inspection apparatus,
    wherein said semiconductor inspection apparatus includes:
    a support member supporting said semiconductor wafer;
    a probe sheet having a third principal surface facing said first principal surface of said semiconductor wafer with desired space provided therebetween, a fourth principal surface which is on the other side of said third principal surface, a plurality of contact terminals disposed on said third principal surface, a plurality of wirings respectively led from said plurality of contact terminals, and a plurality of lead electrodes led to said fourth principal surface via said plurality of wirings;
    a tester connected to said plurality of lead electrodes of said probe sheet and electrically inspecting said plurality of semiconductor chips of said semiconductor wafer at one time; and
    pressure reducing means for reducing the pressure of said desired space, and
    in the inspection of said step (c), the plurality of electrodes of the plurality of semiconductor chips of said semiconductor wafer are brought into contact with the plurality of contact terminals of said probe sheet by mainly deforming said semiconductor wafer by reducing the pressure of said desired space by using said pressure reducing means, and in this state, the plurality of semiconductor chips are electrically inspected at one time.

6. The manufacturing method of a semiconductor device according to claim 5,
    wherein parts of said plurality of contact terminals which come into contact with the respective electrodes of the plurality of semiconductor chips of said semiconductor wafer are formed to have a pyramidal or truncated pyramidal shape.

7. The manufacturing method of a semiconductor device according to claim 5, further comprising: after said step (c), a step of cutting and separating said semiconductor wafer into said plurality of individual semiconductor chips; and a step of molding said plurality of individually separated semiconductor chips with a resin.

8. The manufacturing method of a semiconductor device according to claim 5, further comprising: after said step (b) and before said step (c), a step of forming the plurality of semiconductor chips of said semiconductor wafer with an insulating layer at one time and forming electrodes rearranged on the surface of said insulating layer,
  wherein, in said step (c), said plurality of semiconductor chips of said semiconductor wafer after said insulating layer forming step are electrically inspected by said semiconductor inspection apparatus.

9. The manufacturing method of a semiconductor device according to claim 5, further comprising: after said step (b) and before said step (c), a step of dividing said semiconductor wafer into a plurality of semiconductor chips;
  wherein, in said step (c), said plurality of semiconductor chips of said divided semiconductor wafer are electrically inspected by said semiconductor inspection apparatus.

10. The manufacturing method of a semiconductor device according to claim 5, further comprising: after said step (b) and before said step (c), a step of forming the plurality of semiconductor chips of said semiconductor wafer with an insulating layer at one time and forming electrodes rearranged on the surface of said insulating layer; and before said step (c), a step of dividing said semiconductor wafer after said insulating layer forming step into a plurality of semiconductor chips,
  wherein, in said step (c), said plurality of semiconductor chips of said divided semiconductor wafers after the insulating layer forming step are electrically inspected by using said semiconductor inspection apparatus.

11. The manufacturing method of a semiconductor device according to claim 5,
  wherein, in the inspection of said step (c), electrical properties of said plurality of semiconductor chips of said semiconductor wafer are inspected at intervals, and this inspection is repeated to inspect all of the semiconductor chips of said semiconductor wafer.

* * * * *